US012765109B2

(12) United States Patent
Ono et al.

(10) Patent No.: US 12,765,109 B2
(45) Date of Patent: Oct. 13, 2026

(54) SEMICONDUCTOR OPTICAL DEVICE

(71) Applicant: Lumentum Japan, Inc., Sagamihara (JP)

(72) Inventors: Shuhei Ono, Sagamihara (JP); Takayuki Nakajima, Tokyo (JP)

(73) Assignee: LumentumRadiant GmbH, Baar (CH)

( * ) Notice: Subject to any disclaimer, the term of this patent is extended or adjusted under 35 U.S.C. 154(b) by 551 days.

(21) Appl. No.: 18/146,168

(22) Filed: Dec. 23, 2022

(65) Prior Publication Data

US 2024/0038907 A1 Feb. 1, 2024

(30) Foreign Application Priority Data

Jul. 28, 2022 (JP) ................................ 2022-120789
Sep. 26, 2022 (JP) ................................ 2022-152803

(51) Int. Cl.

| | |
|---|---|
| ***H10F 77/20*** | (2025.01) |
| ***G02F 1/015*** | (2006.01) |
| ***H01S 5/042*** | (2006.01) |
| ***H10F 77/14*** | (2025.01) |
| ***H10F 77/30*** | (2025.01) |

(52) U.S. Cl.
CPC ......... *H10F 77/206* (2025.01); *G02F 1/0155* (2021.01); *H01S 5/04256* (2019.08); *H10F 77/147* (2025.01); *H10F 77/306* (2025.01)

(58) Field of Classification Search
CPC .... H10F 77/206; H10F 77/147; H10F 77/306; G02F 1/0155; H01S 5/04256; H01S 5/04257; H01S 5/16; H01S 5/028; H01S 2301/176; H10H 20/034; H10H 20/819; H10H 20/831; H10H 20/841
See application file for complete search history.

(56) References Cited

U.S. PATENT DOCUMENTS

2005/0127383 A1* 6/2005 Kikawa ..................... H01S 5/12 257/98
2013/0193464 A1* 8/2013 Bae ...................... H10H 20/857 257/94
2016/0126422 A1* 5/2016 Jeon ..................... H10H 20/831 257/98
2020/0343413 A1* 10/2020 Bono .................. H10H 20/857

FOREIGN PATENT DOCUMENTS

CN 102414944 B * 6/2014 ........... H01S 5/2031
JP S63302586 A 12/1988
JP H10178231 A 6/1998

* cited by examiner

*Primary Examiner* — Sitaramarao S Yechuri
(74) *Attorney, Agent, or Firm* — Harrity & Harrity, LLP

(57) ABSTRACT

A substrate includes first and second sides, the first side being flat, the second side including upper and lower sides, the lower side protruding from the upper side to form a step. An optical function layer is on a top of the substrate, the optical function layer including first and second end faces, the first end face being flush with the first side, the second end face being flush with the upper side of the second side. A first film continuously covers the first end face and the first side. A second film is different in reflectance from the first film, the second film continuously covering the second end face and the upper side. A first electrode is electrically connected to a top of the optical function layer. A second electrode is electrically connected to a bottom of the optical function layer.

20 Claims, 25 Drawing Sheets

SEMICONDUCTOR OPTICAL DEVICE

CROSS-REFERENCE TO RELATED APPLICATIONS

This Patent Applications claims priority to Japanese patent application number 2022-120789 filed on Jul. 28, 2022 and Japanese patent application number 2022-152803 filed on Sep. 26, 2022, the contents of which are hereby incorporated by reference into this application.

TECHNICAL FIELD

The present disclosure relates generally to a semiconductor optical device.

BACKGROUND

A semiconductor optical device used in optical communications includes an optical function layer that serves as an emission layer or an absorption layer. A semiconductor laser, for example, is equipped with a low-reflection film on a front facet to emit light and a high-reflection film on an opposite rear facet.

In some cases, a groove is formed in a wafer by etching, a deposition process is performed on an inner surface of the groove, and a bottom surface of the groove is cut. This makes the inner surface of the groove an end face of a product, and a protection film (dielectric film, metal film) is formed on it. The protection film can be formed on the wafer to improve work efficiency and reduce costs. To form protection films with asymmetric reflectance on both end faces, one end face or a previously formed protection film is covered with a resist, and then a protection film is formed on another end face.

In some cases, a deposition process is performed on some products, each of which has one end face exposed and another end face connected, and then these are cleaved and the deposition process is performed again. According to this process, protection films with asymmetric reflectance can be formed on both end faces without any resist.

An orientation of a semiconductor optical device should be distinguished for mounting the semiconductor optical device. However, low- and high-reflection films cannot be visually differentiated in reflectance, making it difficult to distinguish an orientation of the semiconductor optical device.

SUMMARY

Some implementations described herein distinguish an orientation of a semiconductor optical device.

In some implementations, a semiconductor optical device includes: a substrate including a first side and a second side that are opposite to each other, the first side being flat, the second side including an upper side and a lower side, the lower side protruding from the upper side to form a step; an optical function layer on a top of the substrate, the optical function layer including a first end face and a second end face that are opposite to each other, the first end face being flush with the first side, the second end face being flush with the upper side of the second side; a first film continuously covering the first end face and the first side; a second film different in reflectance from the first film, the second film continuously covering the second end face and the upper side of the second side; a first electrode electrically connected to a top of the optical function layer; and a second electrode electrically connected to a bottom of the optical function layer.

DETAILED DESCRIPTION

Figure 1:
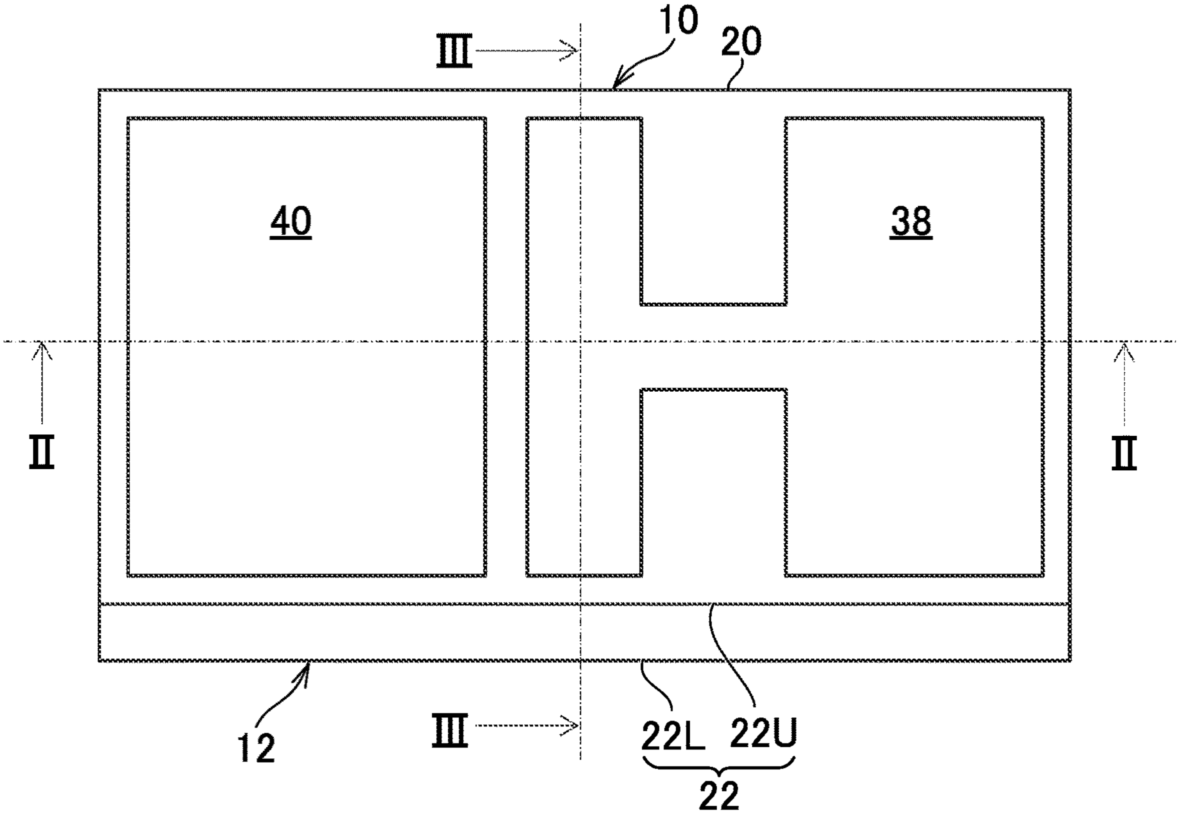
FIG. 1 is a plan view of a semiconductor optical device in a first example implementation.

Some implementations are specifically described in detail in the following with reference to drawings. In the drawings, the same members are denoted by the same reference numerals and have the same or equivalent functions, and a repetitive description thereof may be omitted for the sake of simplicity. Note that, the drawings referred to in the following are only for illustrating the example implementations, and are not necessarily drawn to scale.

Figure 2:
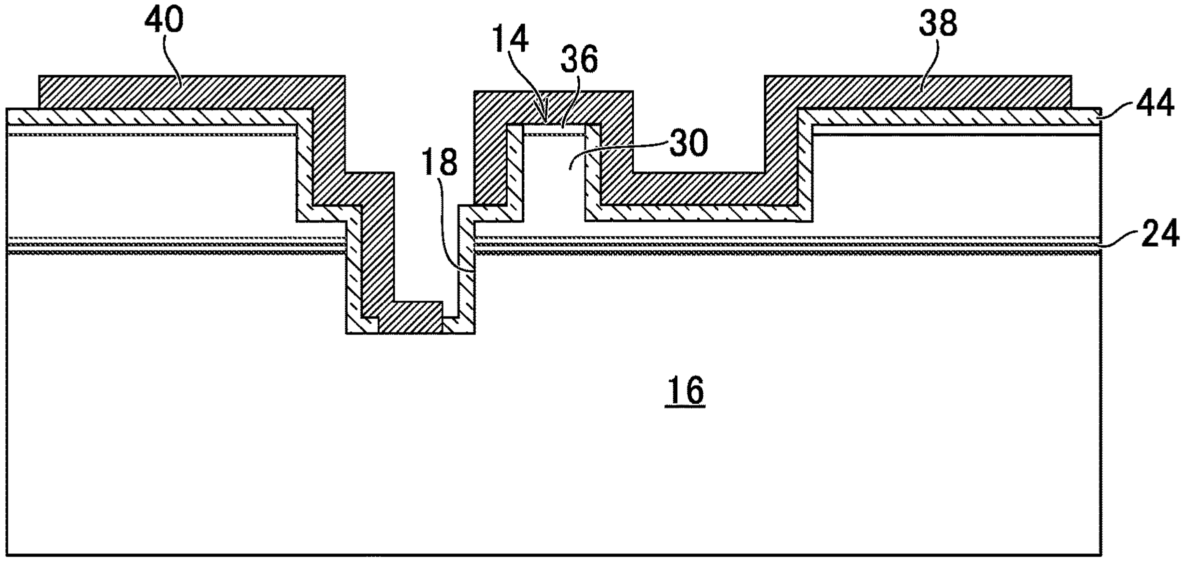
FIG. 2 is a II-II cross-sectional view of the semiconductor optical device in FIG. 1.
Figure 3:
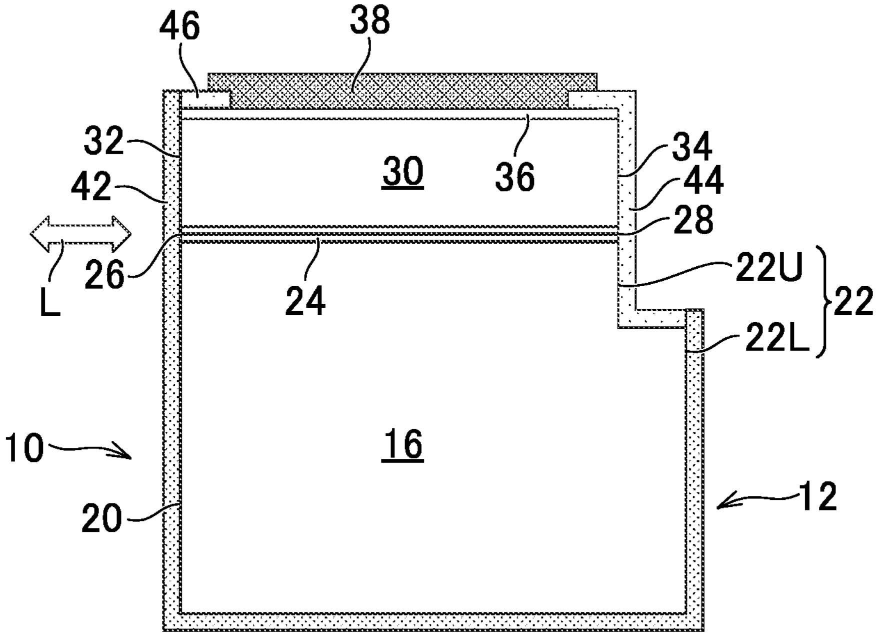
FIG. 3 is a cross-sectional view of the semiconductor optical device in FIG. 1.

FIG. 1 is a plan view of a semiconductor optical device in a first example implementation. FIG. 2 is a II-II cross-sectional view of the semiconductor optical device in FIG. 1. FIG. 3 is a cross-sectional view of the semiconductor optical device in FIG. 1.

The semiconductor optical device may be an end-face emitting type or an end-face incident type, being a semiconductor laser, a modulator, or a photodetector. The semiconductor optical device may include a front facet 10 and a rear facet 12 that may be opposite to each other. The front facet 10 may be an emitting surface or an incident surface of light L (FIG. 3) to be used as signals for optical communications. The semiconductor optical device may include a mesa structure 14 (FIG. 2). The rear facet 12 may have a shape with a lower portion protruding from an upper portion (FIG. 3). The upper portion should may have a height equal to or less than one tenth (1/10) of an overall thickness of the semiconductor optical device.

The semiconductor optical device may include a substrate 16. At least an uppermost surface (e.g., an entirety) of the substrate 16 may comprise a semiconductor of a first conductivity type. The substrate 16 may be structured to include an insulating layer and a semiconductor layer on it. As shown in FIG. 2, the substrate 16 may include a recess 18 in a top. The recess 18 may extend next to and along the mesa structure 14.

As shown in FIG. 3, the substrate 16 may include a first side 20 and a second side 22 that may be opposite to each other. The first side 20 may be flat. The second side 22 may include an upper side 22U and a lower side 22L. The lower side 22L protrudes from the upper side 22U to form a step.

The semiconductor optical device may include an optical function layer 24. For a semiconductor laser, the optical function layer 24 may be an active layer (multiple quantum well layer), which oscillates light L in response to an injected current. The light L generated in the optical function layer 24 may be emitted from the front facet 10. For a modulator or a photodetector, the optical function layer 24 may be an absorption layer, which absorbs light L incoming from the front facet 10.

The optical function layer 24 may be below the mesa structure 14 and may extend below an area adjacent to the mesa structure 14. The optical function layer 24 may be located on the top of the substrate 16. The optical function layer 24 may avoid being within the recess 18 in the substrate 16. Alternatively, the optical function layer 24 may be separated by the recess 18. Other layers (optical confinement layer, diffraction grating layer) may be provided between the substrate 16 and the optical function layer 24.

As shown in FIG. 3, the optical function layer 24 may include a first end face 26 and a second end face 28 that may be opposite to each other. The optical function layer 24 may extend between the first end face 26 and the second end face 28. The first end face 26 and the second end face 28 may be part of the front facet 10 and part of the rear facet 12, respectively. The optical function layer 24 may be between the front facet 10 and the rear facet 12. The first end face 26 may be flush with the first side 20. The second end face 28 may be flush with the upper side 22U of the second side 22.

The semiconductor optical device may include a semiconductor layer 30. The semiconductor layer 30 may be of a second conductivity type. The semiconductor layer 30 may be on the top of the optical function layer 24. Other layers (optical confinement layer, diffraction grating layer) may be provided between the optical function layer 24 and the semiconductor layer 30. As shown in FIG. 2, a bottom edge of the mesa structure 14 may be part of the semiconductor layer 30. As shown in FIG. 3, the semiconductor layer 30 may include a first tip surface 32 flush with the first end face 26. The semiconductor layer 30 may include a second tip surface 34 flush with the second end face 28. There may be a contact layer 36 on the semiconductor layer 30. The contact layer 36 may comprise a semiconductor of the second conductivity type. Here, the first conductivity type may be an n-type and the second conductivity type may be a p-type.

The semiconductor optical device may include a first electrode 38. As shown in FIG. 2, the first electrode 38 may be in contact with the top (contact layer 36) of the mesa structure 14. The first electrode 38 may be electrically connected to the top of the optical function layer 24 through the semiconductor layer 30.

The semiconductor optical device may include a second electrode 40. As shown in FIG. 2, the second electrode 40 may extend within the recess 18 in the substrate 16 and may be in contact with the substrate 16 at a bottom of the recess 18. The second electrode 40 may be electrically connected to a bottom surface of the optical function layer 24 through the substrate 16. Alternatively, a first conductivity-type semiconductor layer, in contact with the second electrode 40, may be placed on an insulating layer. As shown in FIG. 1, the first electrode 38 and the second electrode 40 may be located above the optical function layer 24 and may comprise metal.

The semiconductor optical device may include a first film 42. As shown in FIG. 3, the first film 42 may continuously cover the first end face 26 and the first side 20. The first film 42 may continuously extend to the first tip surface 32 of the semiconductor layer 30. The first film 42 may avoid overlapping with an underlying surface (contact layer 36) on which the first electrode 38 is disposed. The first film 42 may be also disposed on a back of the substrate 16. The first film 42 may continuously extend to the lower side 22L of the second side 22. Part of the first film 42, which adheres to the lower side 22L of the second side 22, may be a protection film rather than a reflection film.

The first film 42 may be an insulating film, being a low-reflective protection film (e.g., multiple layers such as a silicon oxide film, a silicon film, and an alumina film) that may have a low reflectance to a wavelength of light, generated by the optical function layer 24 for a semiconductor laser, or absorbed by the optical function layer 24 for a modulator or a photodetector. Its reflectance may be less than or equal to 1%.

The semiconductor optical device may include a second film 44. The second film 44 may continuously cover the second end face 28 and the upper side 22U of the second side 22. The second film 44 continuously extends to the second tip surface 34 of the semiconductor layer 30. The second film 44 continuously extends from the second end face 28. The second film 44 extends to the underlying surface (contact layer 36) on which the first electrode 38 may be disposed. The second film 44 overlaps under an edge (near the second film 44) of the first electrode 38, but it does not cover an entirety of the top of the mesa structure 14.

The second film 44 differs in reflectance from the first film 42. The first film 42 may be lower in reflectance than the second film 44. The second film 44 may comprise an insulator. The second film 44 may be a high-reflective protection film having a high reflectance to a wavelength of light produced or absorbed by the optical function layer 24. Its reflectance may be greater than or equal to 90%. The first film 42 may be thinner than the second film 44. As a variation, the first film 42 may be a high-reflection film and the second film 44 may be a low-reflection film.

The first film 42 and the second film 44 ensure reliability by preventing degradation and destruction of incident and emitting surfaces of the light L, and additionally improve characteristics of the semiconductor optical device by reflecting the light transmitted through the optical function layer 24.

The semiconductor optical device may include an insulating film 46. The insulating film 46 may overlap another edge (near the first film 42) of the first electrode 38. The insulating film 46 may be comprise the same material as the second film 44 and may also be a separate part of the second film 44.

In this example implementation, the front facet 10 (without a step) and the rear facet 12 (with a step) may have different shapes, making it easy to ascertain front and rear orientations. In particular, when viewed from a side as shown in FIG. 3, the difference in shape is easily seen.

Ascertaining an electrode shape may depend on the first electrode 38 as a reference. For example, place the semiconductor optical device so that a lead-out line from the top of the mesa structure 14 extends to a right side, and an upper part may be ascertained as a front. However, ascertaining which is the front facet or the rear facet, with a low magnification microscope or with no microscope, may be difficult due to small differences between the first electrode 38 and the second heater 110 ond electrode 40. On the other hand, differences in shapes of the end faces may be ascertained without using the low magnification microscope, or any microscope, thus enabling a quick check and an accurate determination of device orientations.

Figure 4A:
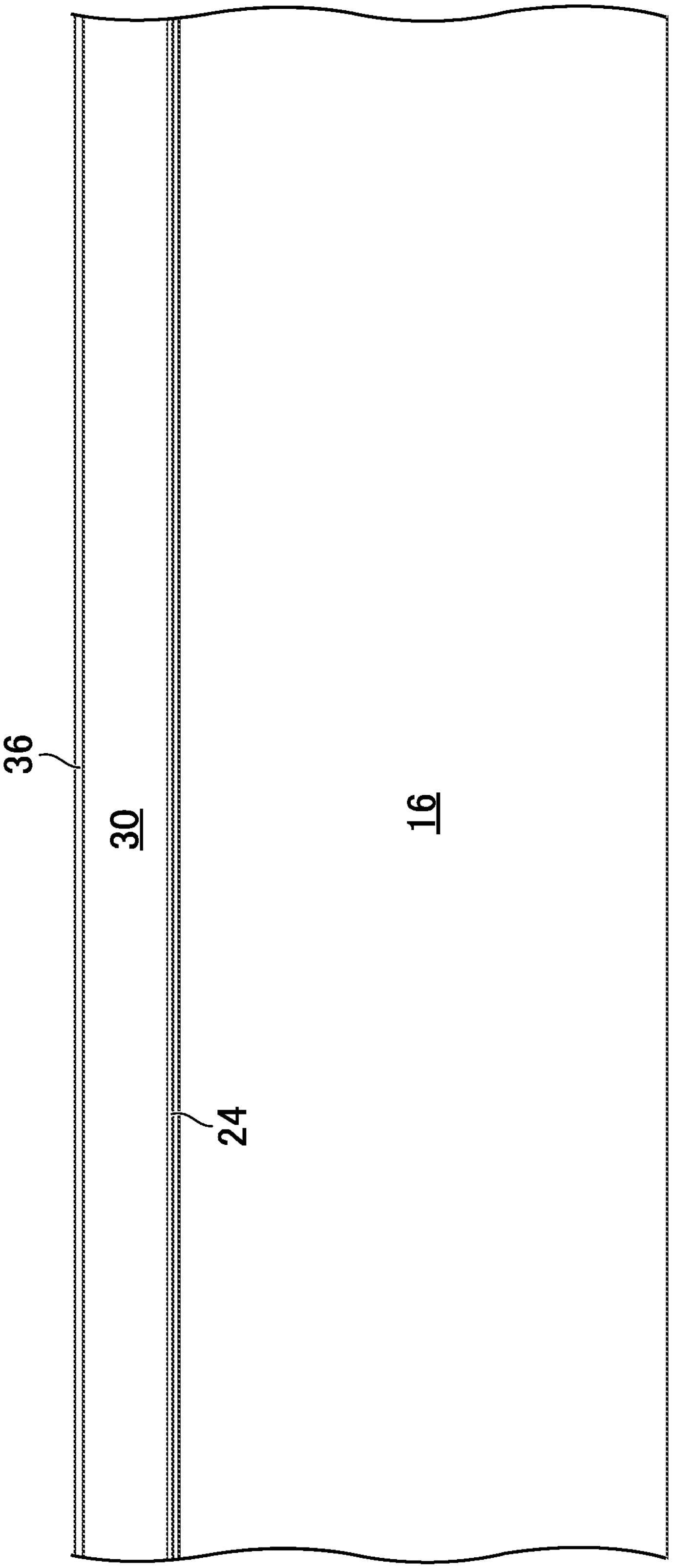
FIG. 4A is a diagram of a manufacturing method for the semiconductor optical device according to the first example implementation.

As shown in FIG. 4A, the optical function layer 24, the semiconductor layer 30, and the contact layer 36 may be formed on the substrate 16. The substrate 16 may be an aggregate of some semiconductor optical devices or a wafer. The optical function layer 24, the semiconductor layer 30, and the contact layer 36 may be formed continuously on the substrate 16.

Figure 4B:
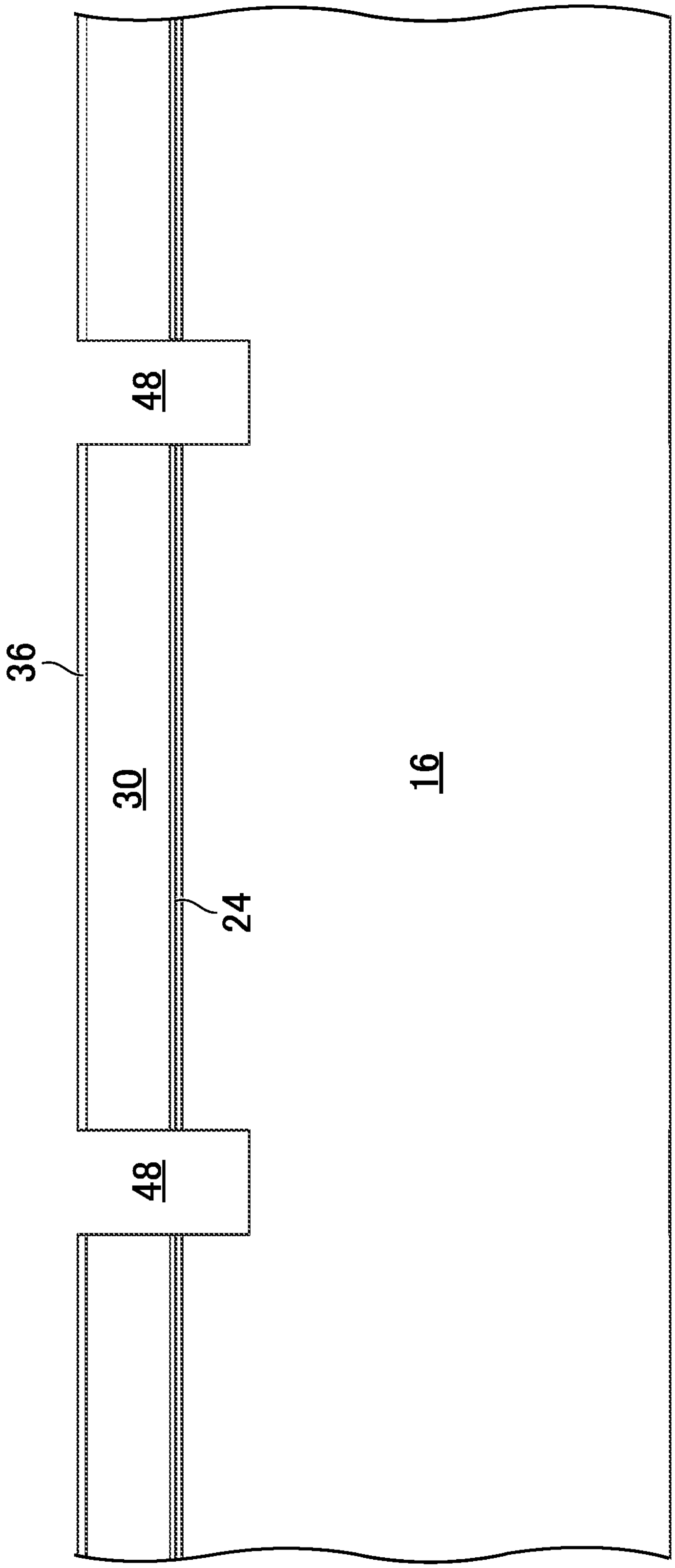
FIG. 4B is a diagram of a manufacturing method for the semiconductor optical device according to the first example implementation.

As shown in FIG. 4B, a groove 48 may be formed, such as by etching. The groove 48 may be formed to have a vertical wall surface. The groove 48 may be formed deeper than the optical function layer 24. The groove 48 may have a depth corresponding to a height of an upper portion of the rear facet 12 (FIG. 3). The wall surface may be to be the upper side 22U of the second side 22 of the substrate 16, the second end face 28 of the optical function layer 24, and the second tip surface 34 of the semiconductor layer 30. The groove 48 may have a width (perpendicular to an extending direction of the groove 48) of 20 μm or more.

Figure 4C:
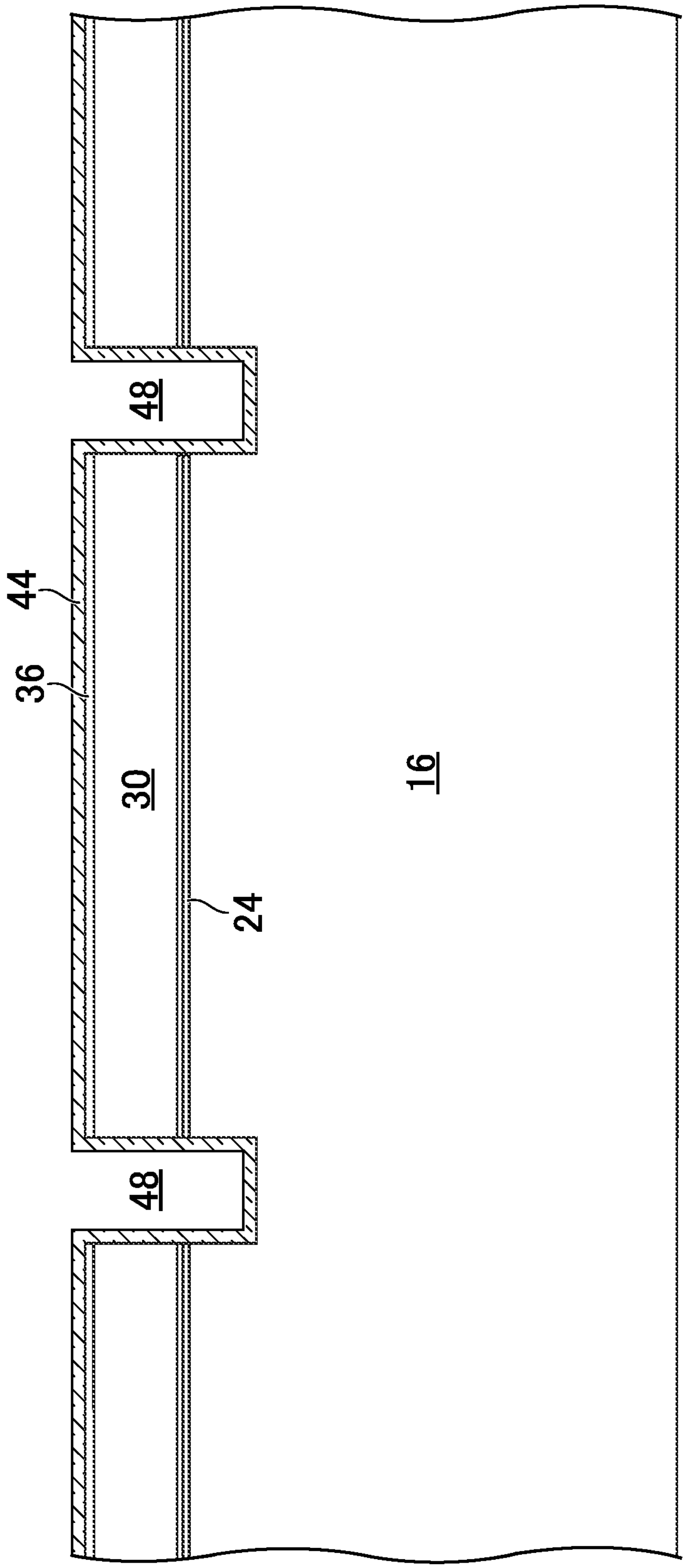
FIG. 4C is a diagram of a manufacturing method for the semiconductor optical device according to the first example implementation.

As shown in FIG. 4C, the second film 44 may be formed. The second film 44 may be formed to cover the semiconductor layer 30, the contact layer 36, and the wall surface and the bottom surface of the groove 48. The second film 44 may have a layer structure (e.g., multiple layers such as a silicon oxide film, a silicon film, and an alumina film) that serves as a high-reflection layer.

Figure 4D:
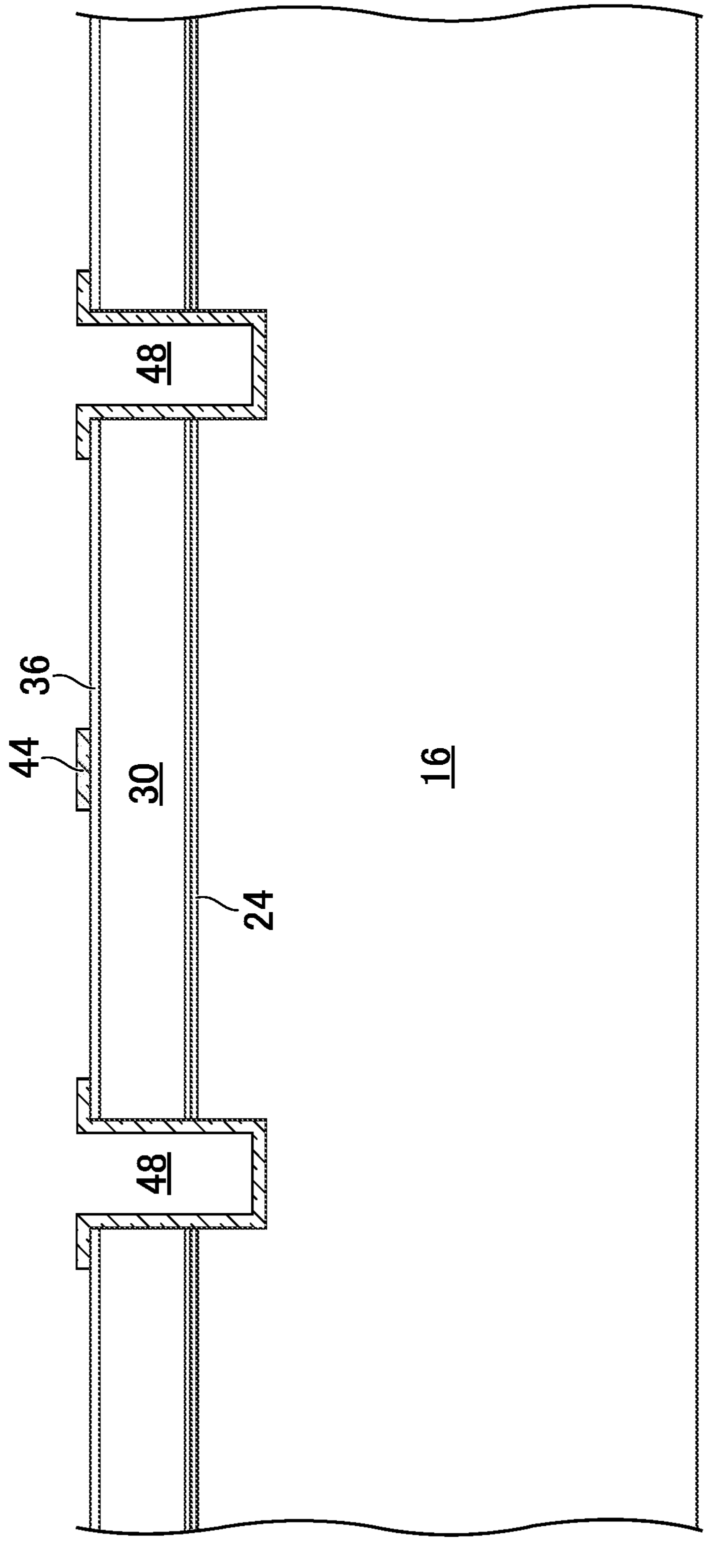
FIG. 4D is a diagram of a manufacturing method for the semiconductor optical device according to the first example implementation.

As shown in FIG. 4D, the second film 44 may be shaped. For example, at an area necessary for electrical connection between the first electrode 38 and the optical function layer 24, part of the second film 44 may be removed by etching. This creates a through hole in the second film 44. Before the etching, a portion (inside the groove 48, for example) of the second film 44 may be covered with an unillustrated resist. The portion of the second film 44 covered by the resist may be left unremoved. The resist may cause a slight damage to the remaining second film 44 although subsequently removed. The second film 44 outside the groove 48 serves as a passivation film to protect a foundation (contact layer 36) from the external environment.

Another formation method may be a lift-off. During the lift-off, a resist may be formed in an area where the second film 44 is not formed, and the second film 44 may be formed on it. Since the second film 44 may be also formed on the resist, removal of the resist may result in removal of the second film 44 deposited on it.

Figure 4E:
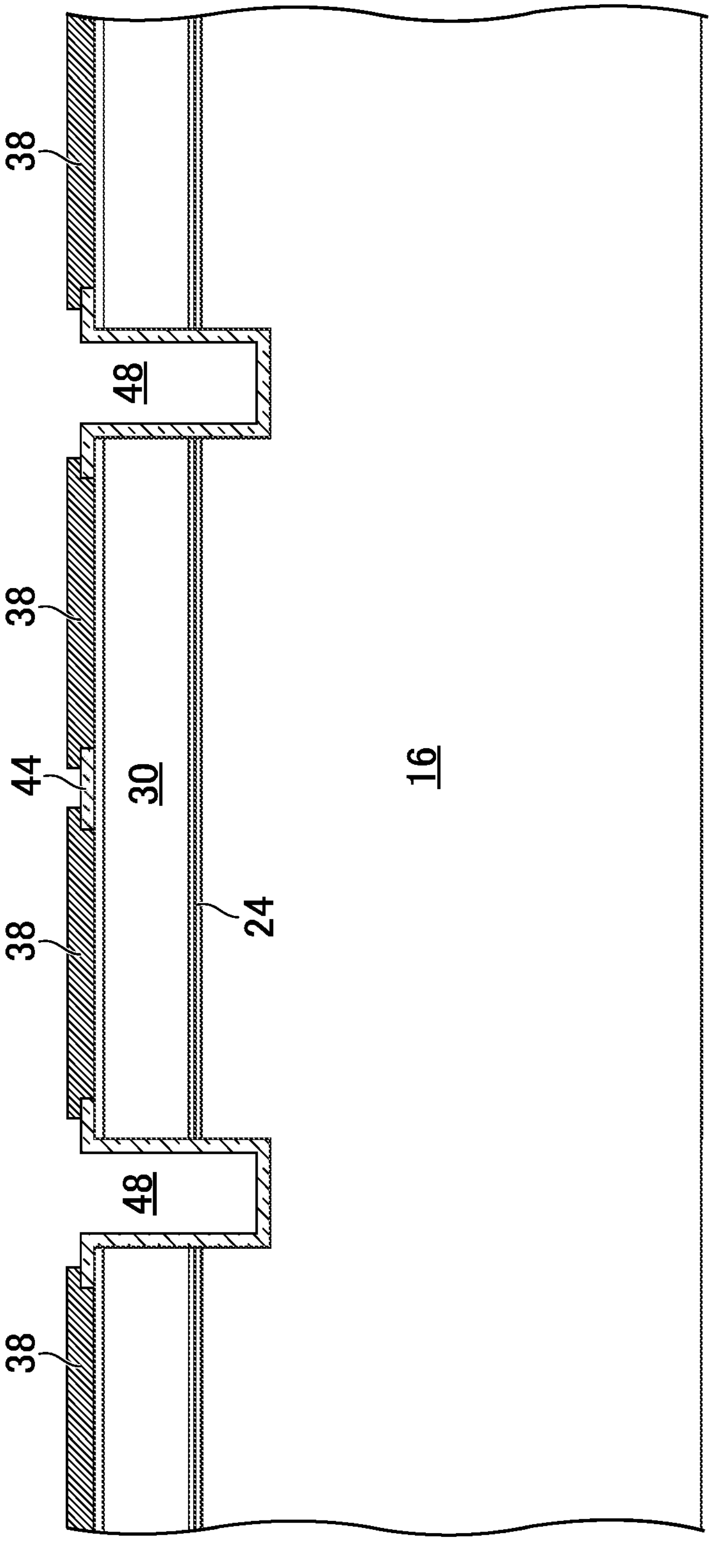
FIG. 4E is a diagram of a manufacturing method for the semiconductor optical device according to the first example implementation.

As shown in FIG. 4E, the first electrode 38 and the second electrode 40 (FIG. 2) may be formed. The formation method may include a deposition process such as vapor deposition. After the metal film is formed on an entire surface, part of it may be removed to form the first electrode 38 and the second electrode 40. During this process, the second film 44 may be exposed to processes of attachment and removal of a metal film, causing a surface damage, which may change film thicknesses.

Another formation method may be a lift-off. During the lift-off, a resist may be formed in an area where the metal film is not formed, and the metal film may be formed on it. Since the metal film may be also formed on the resist, removal of the resist results in removal of the metal film deposited on it. During this process, the second film 44 may be exposed to processes of attachment and removal of the resist, causing a surface damage, which may change film thicknesses. In other words, regardless of the manufacturing method, the second film 44 may be exposed to a process step. Therefore, it may be difficult to keep the second film 44 as it is just after deposition.

Figure 4F:
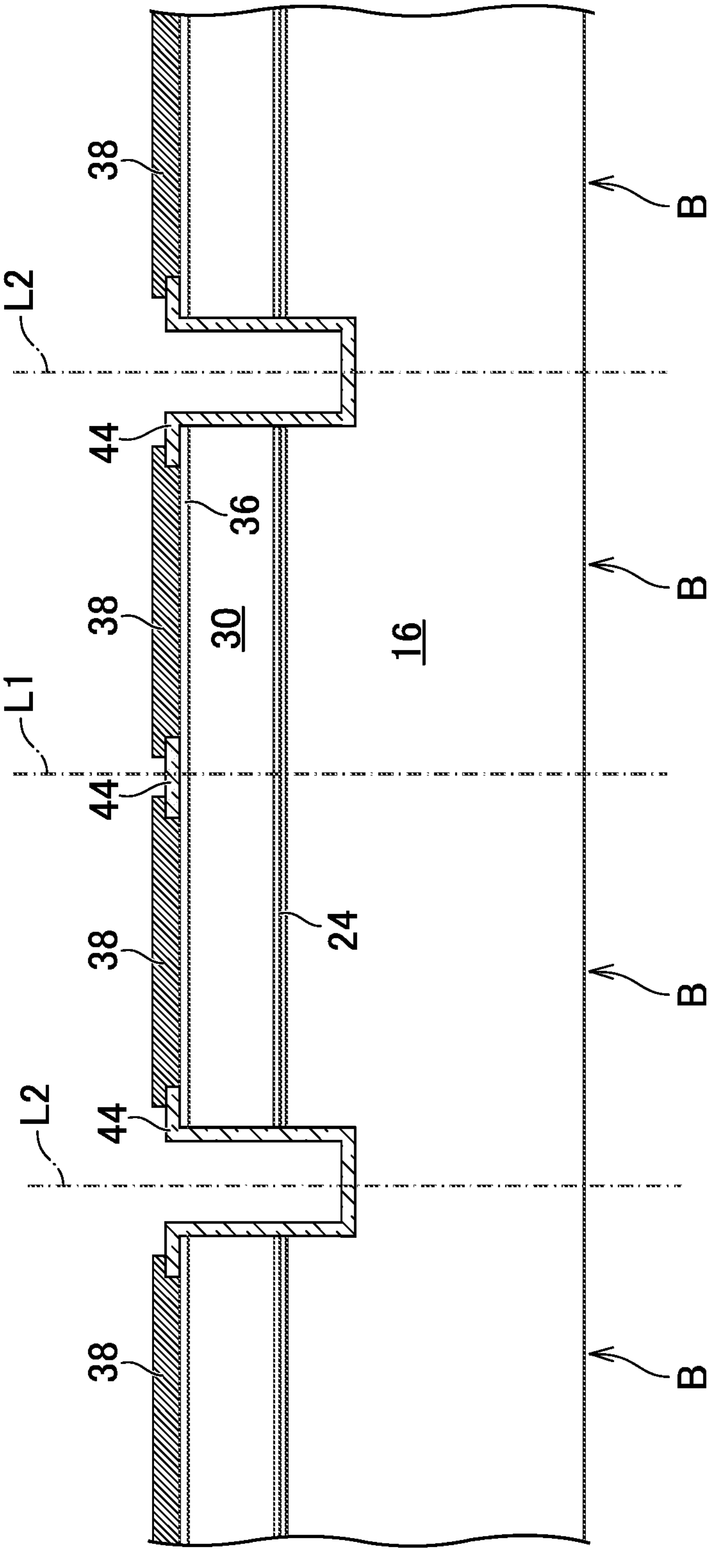
FIG. 4F is a diagram of a manufacturing method for the semiconductor optical device according to the first example implementation.

As shown in FIG. 4F, the substrate 16 (wafer) may be made thinner. This may be done by polishing. Then, the substrate 16 may be cleaved along a first line L1 and a second line L2 to obtain some bars B. Cleaved surfaces may be front and rear surfaces of the bar B. Each bar B may be an aggregate where some workpieces of semiconductor optical devices may be arranged in a row.

The first line L1 and the second line L2 avoid being on the first electrode 38 and second electrode 40. The first line L1 further avoids the groove 48. The surfaces cleaved along the first line L1 include the first side 20 of the substrate 16, the first end face 26 of the optical function layer 24, and the first tip surface 32 of the semiconductor layer 30. The second line L2 may be on the bottom surface of the groove 48. The surfaces cleaved along the second line L2 include the lower side 22L of the second side 22 of the substrate 16.

Figure 4G:
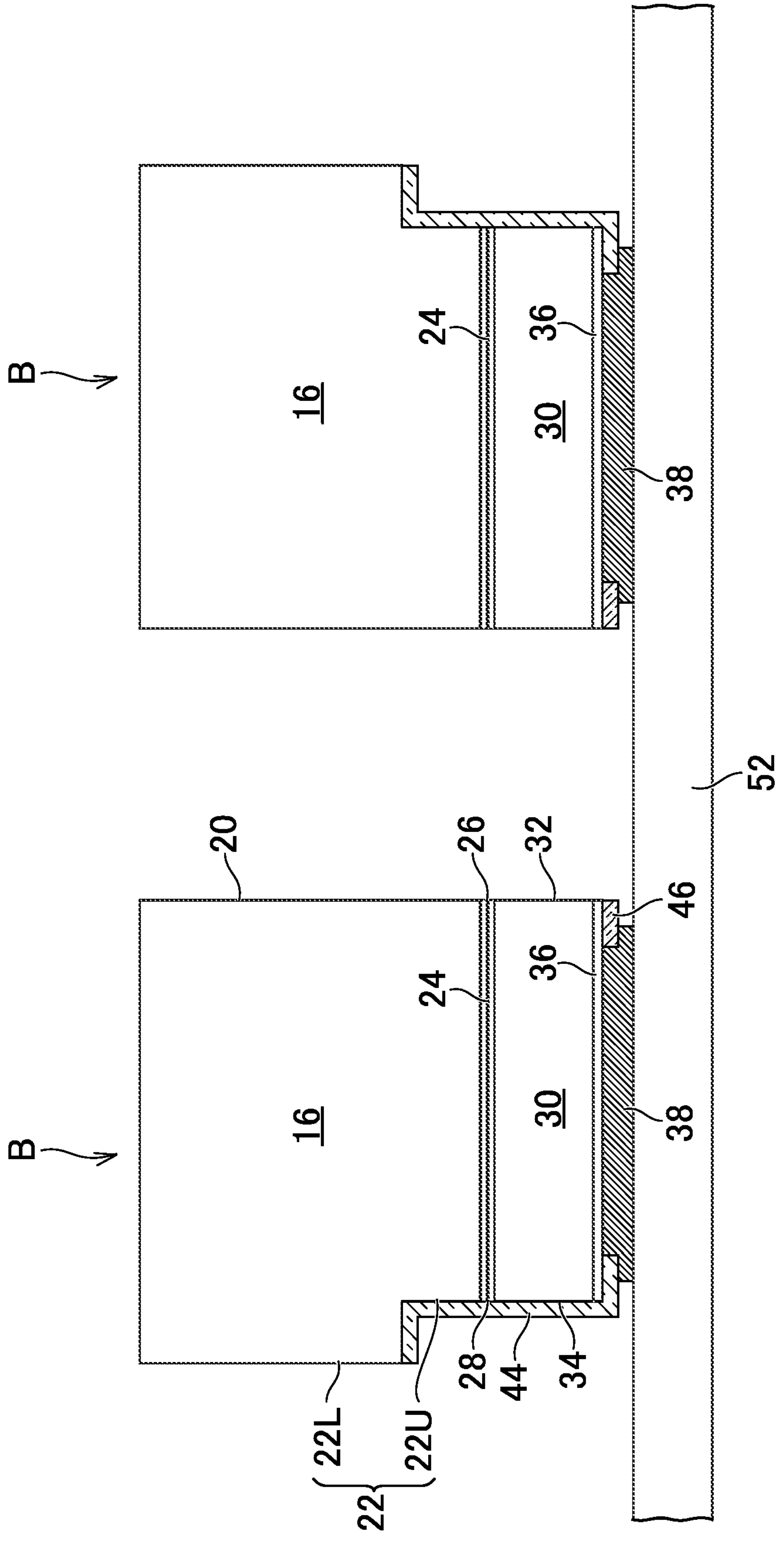
FIG. 4G is a diagram of a manufacturing method for the semiconductor optical device according to the first example implementation.

As shown in FIG. 4G, the bars B may be arranged. There may be a spacing between the adjacent cleaved surfaces. The first electrode 38 and the second electrode 40 (FIG. 2) may face downward. The bars B may be arranged on a stage 52 or a tray.

Figure 4H:
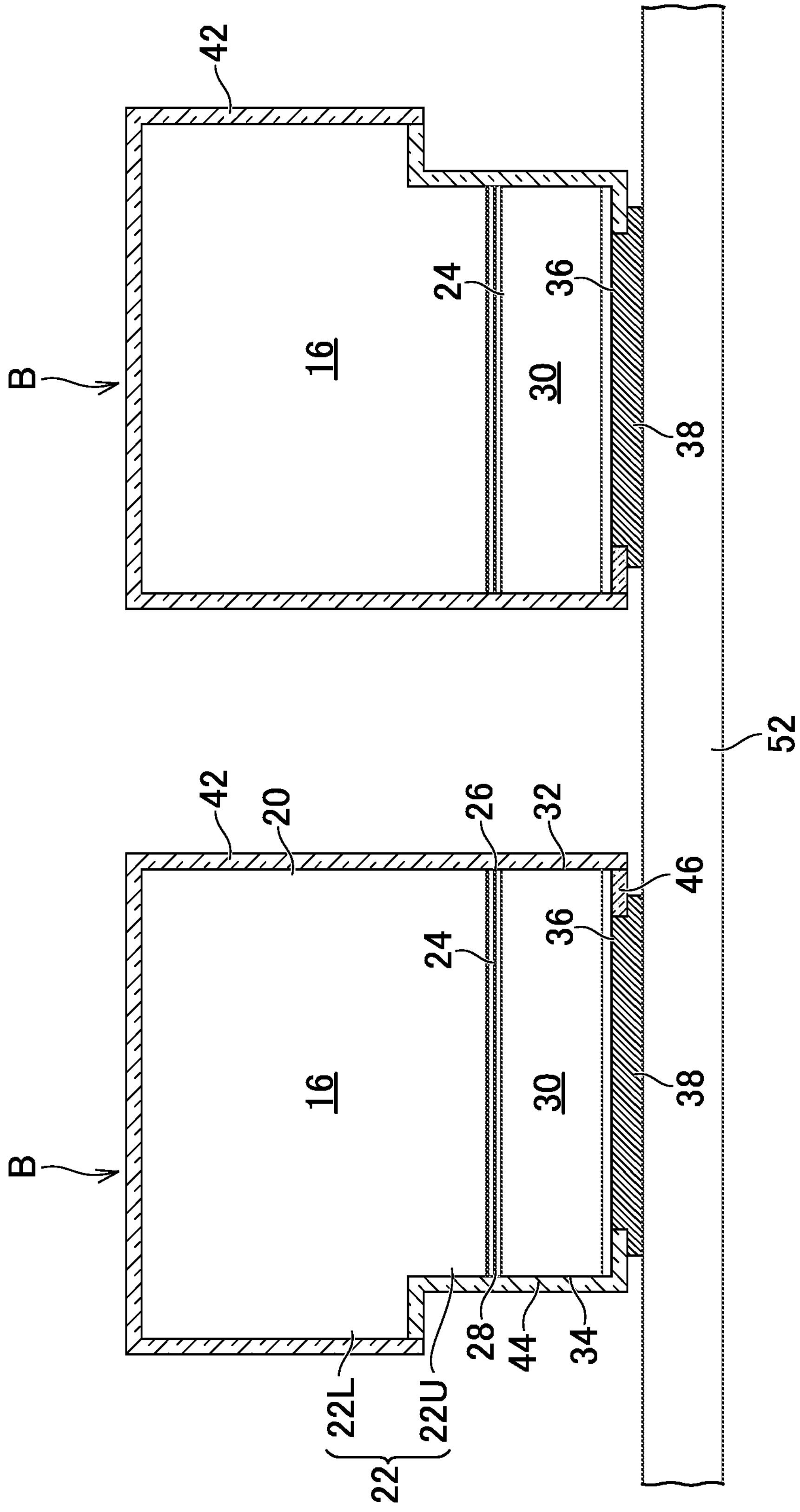
FIG. 4H is a diagram of a manufacturing method for the semiconductor optical device according to the first example implementation.

As shown in FIG. 4H, the first film 42 may be formed. The first film 42 may be formed by sputtering. A deposition system may be used. The first film 42 may be formed on a top and a side of the bar B.

Figure 5:
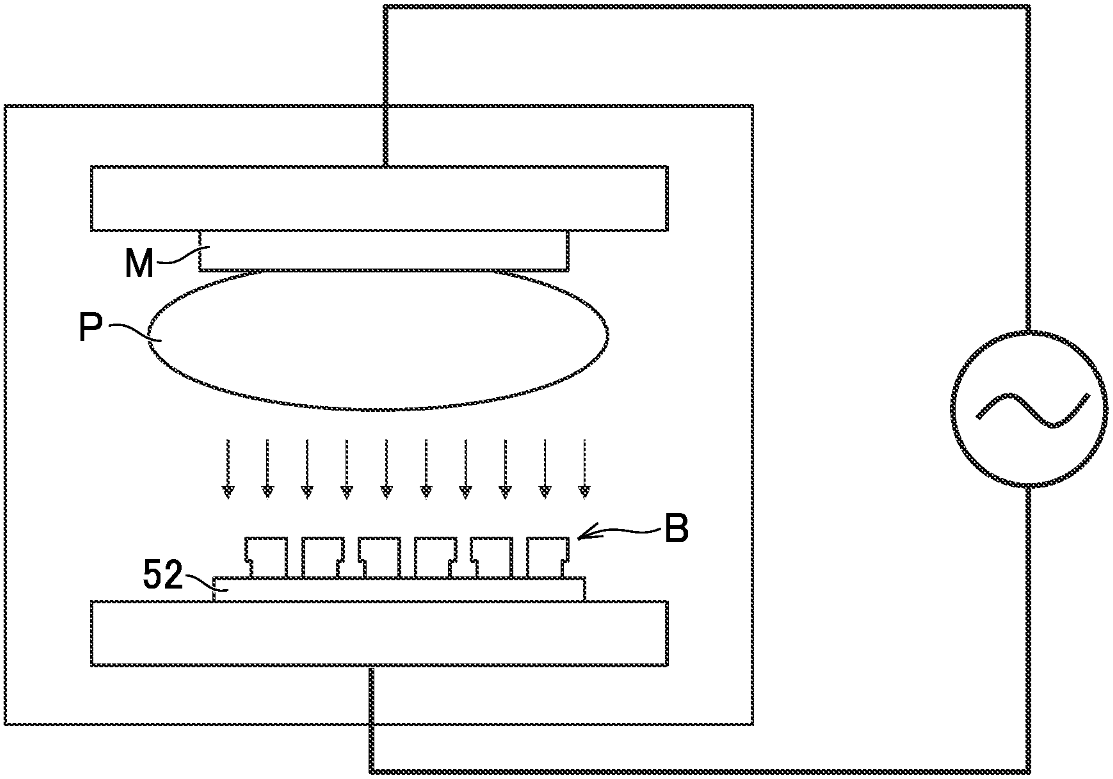
FIG. 5 is a schematic view of a deposition system.

FIG. 5 is a schematic view of the deposition system. An example of the deposition system may be a magnetron sputtering system. In a chamber, an object to be deposited (bars B) may be arranged on a stage 52, and a deposition material M (Si, SiO2, Al2O3) may be placed above it. The chamber may be evacuated and Ar gas may be supplied to it. Apply a high frequency signal between the deposition material and the object to be deposited, and plasma P may be generated. The plasma P hits the deposition material M, causing a sputtering phenomenon, repelling particles. The particles fall downward and adhere to the bars B. The falling particles hit residual gas and ions, changing directions, adhering to sides of the bars B as well.

As shown in FIG. 4H, the first film 42 may be formed on the back of the substrate 16 (top in FIG. 4H), the first side 20, and a tip surface (lower side 22L) of a projection of the second side 22. On the other hand, the projection serves as eaves to prevent the particles of the deposition material M from adhering to a surface (upper side 22U) below the projection, whereby the first film 42 is not formed.

After the above processes, the semiconductor optical device may be obtained by individualizing the bars B. According to this example implementation, after formation of the first film 42, there is no process that damages the first film 42. This can keep the first film 42 as it is just after formation, maintaining stable characteristics.

The low-reflection film may be so thin, compared to the high-reflection film, as to be sensitive to changes in film thickness, and the changes in film thickness after formation lead to undesired characteristics. Therefore, this example implementation may be effective when the first film 42 is a low-reflection film.

In addition, during formation of the protection film (reflection film) on the end face, there is no need to place the bars B in a holder with the end faces lined up in the same direction, this may lead to superior cost performance.

Furthermore, the first film 42 and the second film 44 may be formed in different processes, enabling each of them to be formed in an individual layer structure, with high flexibility in design, leading to low-cost manufacturing of a semiconductor optical device equipped with protection films with different reflectance.

Figure 6:
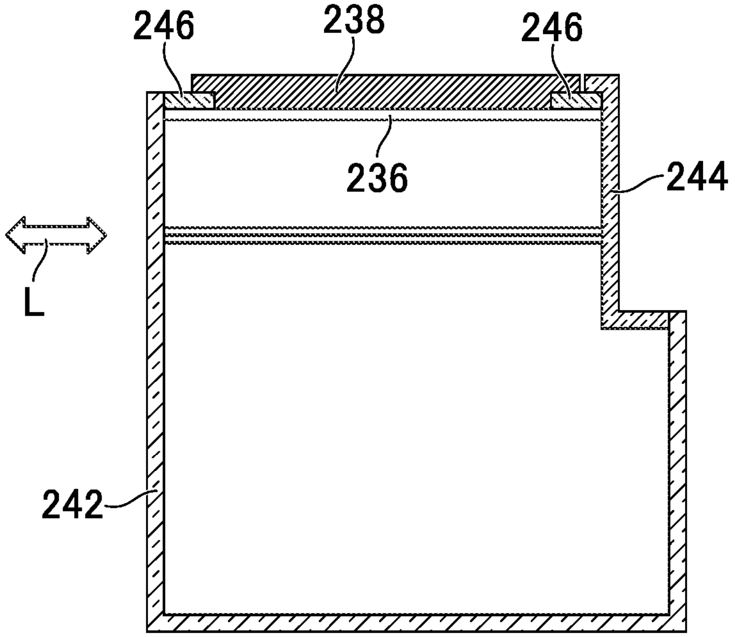
FIG. 6 is a cross-sectional view of a semiconductor optical device in a second example implementation.

FIG. 6 is a cross-sectional view of a semiconductor optical device in a second example implementation. The semiconductor optical device may include an insulating film 246 (passivation film). The insulating film 246 may comprise a material different from the second film 244 (e.g., silicon oxide, silicon) and may be different in thickness from the second film 244. The edge of the second film 244 may be spaced next to the edge of the first electrode 238. The insulating film 246 may continuously overlap under the edge of the second film 244 and under the edge of the first electrode the edge of 238. The manufacturing method may be as follows.

Figure 7A:
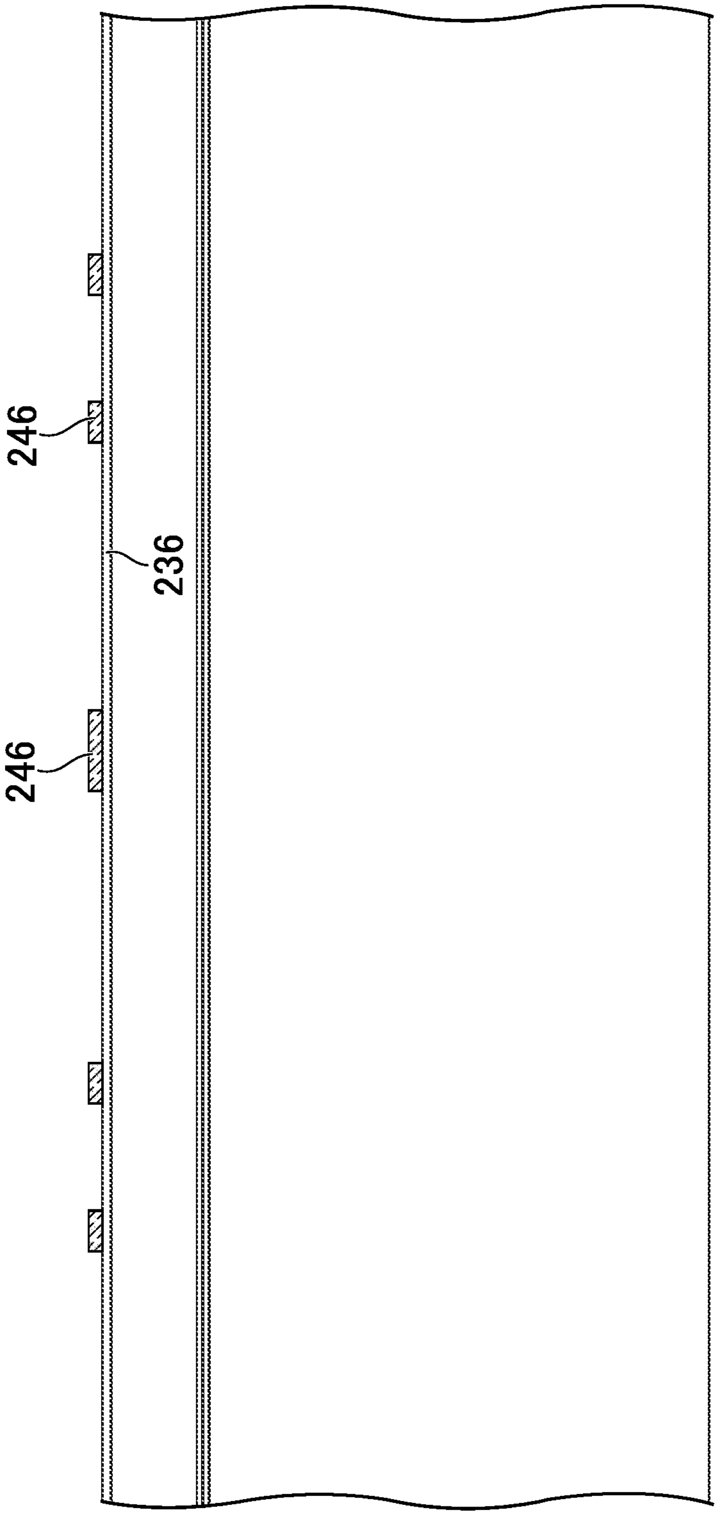
FIG. 7A is a diagram of a manufacturing method for the semiconductor optical device according to the second example implementation.

As shown in FIG. 7A, the insulating film 246 may be formed. In detail, the insulating film 246 may be formed on an entirety of the top of the contact layer 236, and a portion (an area, of the contact layer 236, for connection with the first electrode 238) of it may be removed. What is described in the first example implementation may be applicable to the contact layer 236 and a structure under it.

Figure 7B:
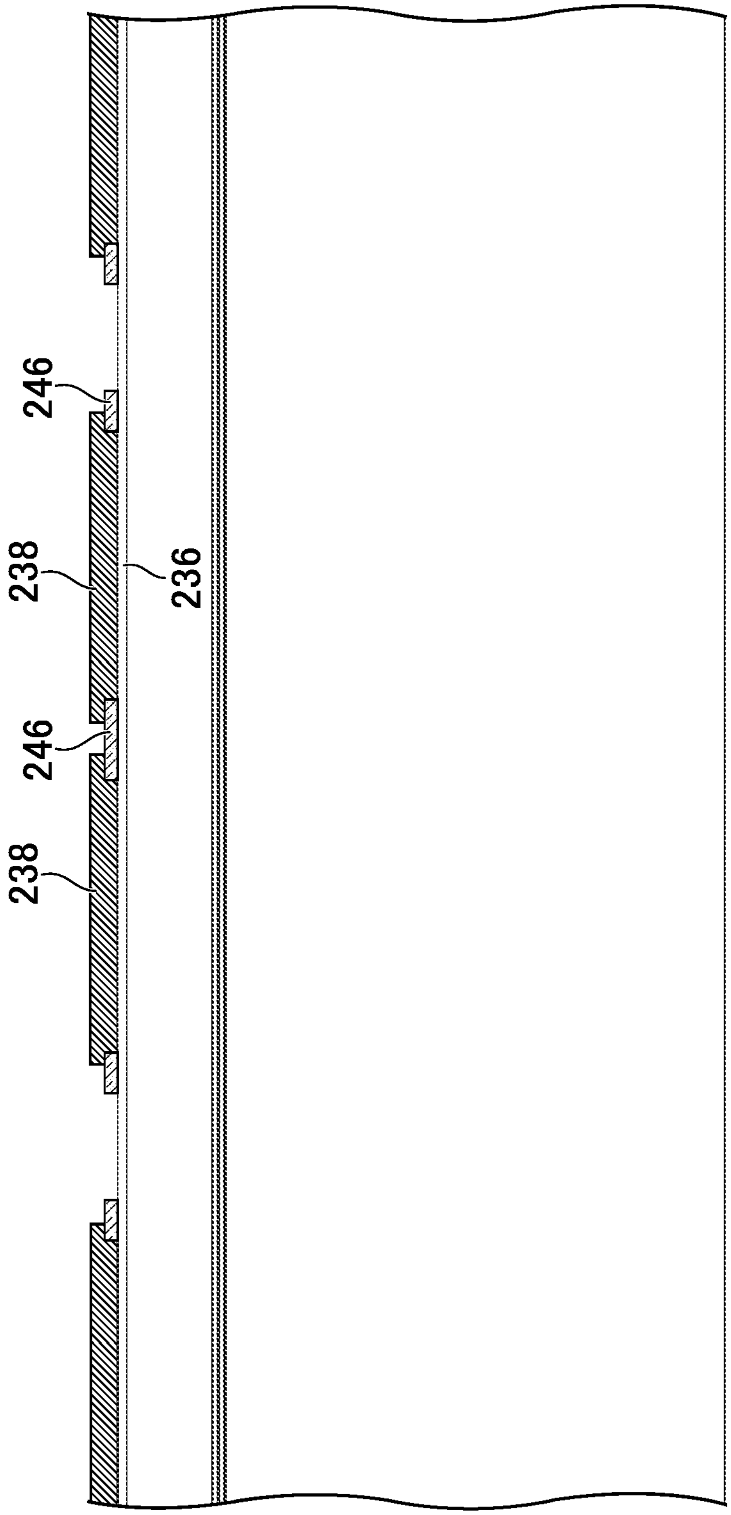
FIG. 7B is a diagram of the manufacturing method for the semiconductor optical device according to the second example implementation.

As shown in FIG. 7B, the first electrode 238 and the second electrode may be formed. Specifically, the metal film may be formed over the entire surface and then part of it may be removed.

Figure 7C:
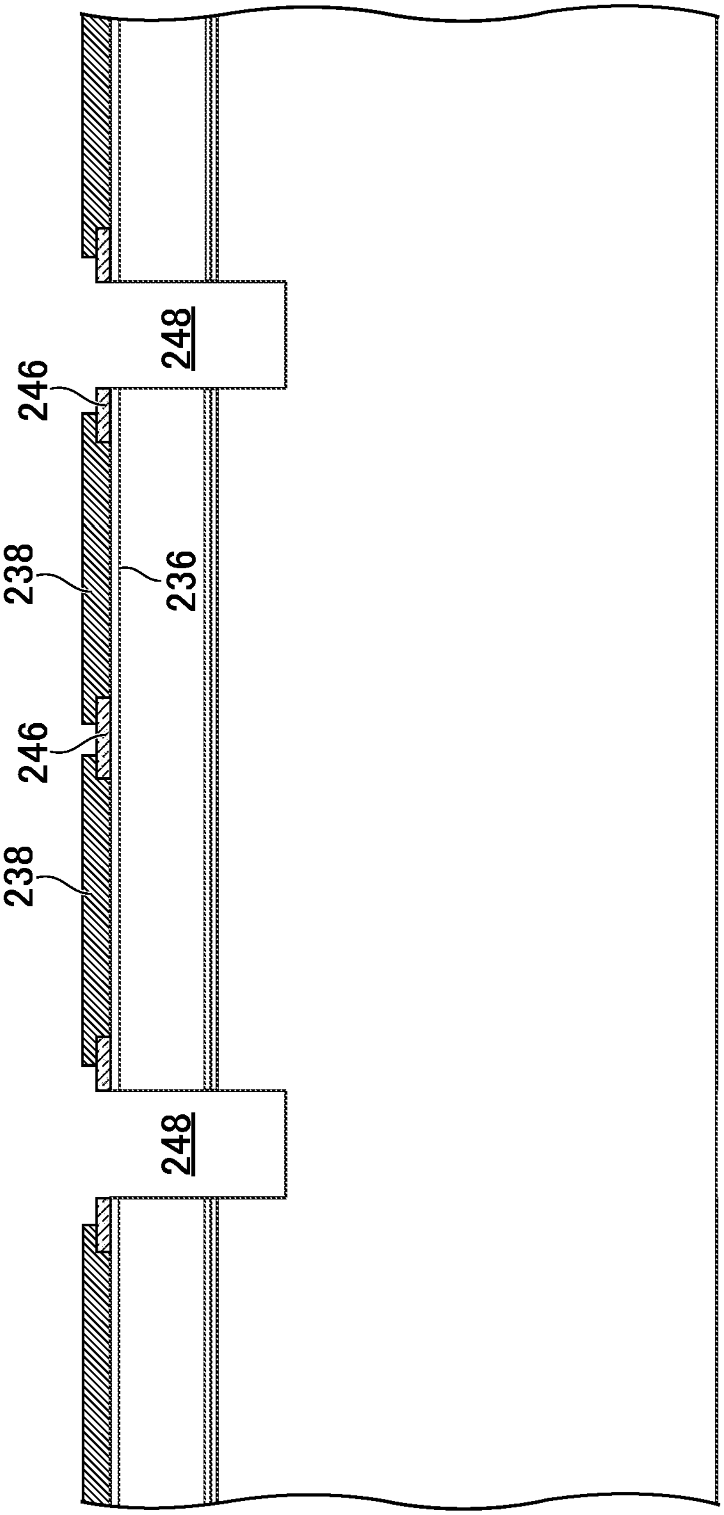
FIG. 7C is a diagram of the manufacturing method for the semiconductor optical device according to the second example implementation.

As shown in FIG. 7C, the groove 248 may be formed. The groove 248 may be formed in an area, of the contact layer 236, exposed from the insulating film 246, the first electrode 238, and the second electrode. The details of groove 248 are as described in the first example implementation.

Figure 7D:
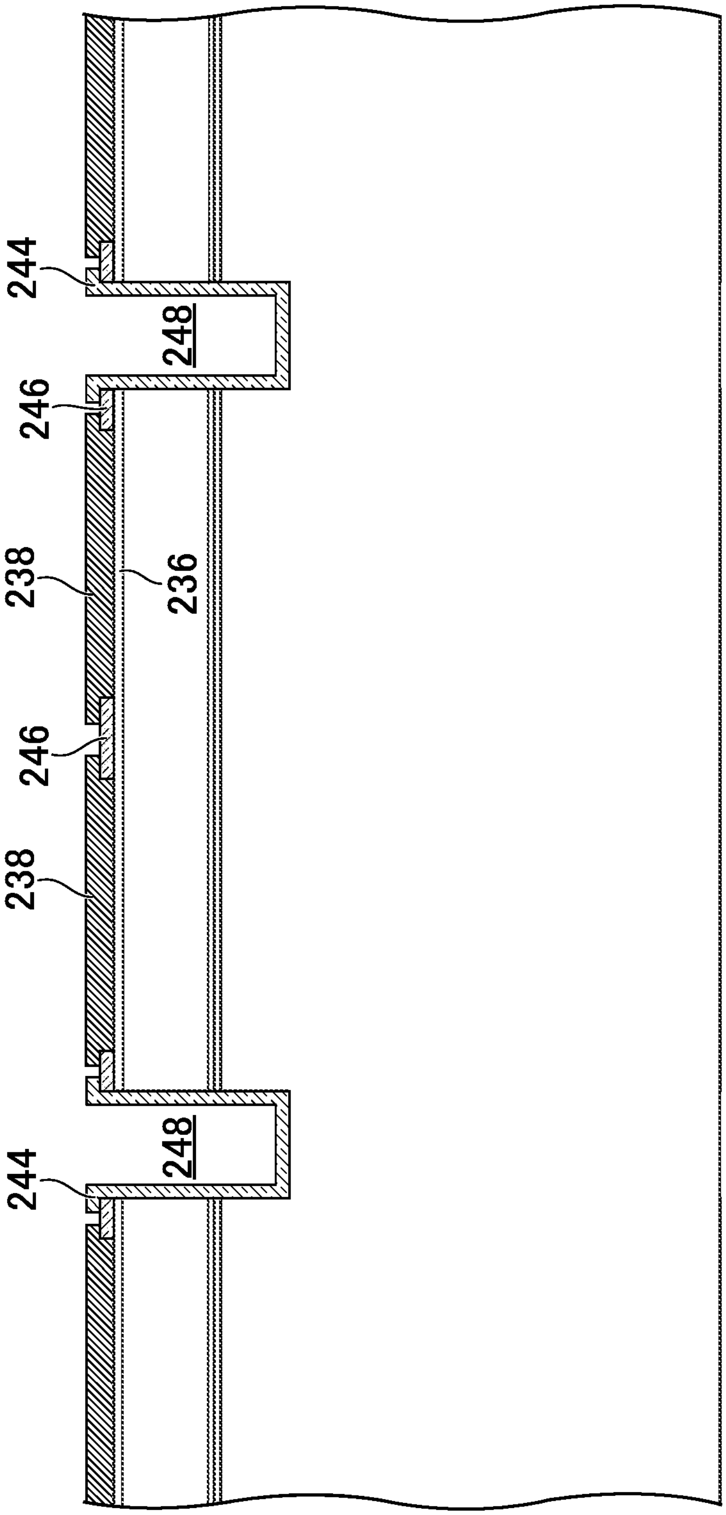
FIG. 7D is a diagram of the manufacturing method for the semiconductor optical device according to the second example implementation.

As shown in FIG. 7D, the second film 244 may be formed. In detail, after forming the second film 244 over the entire surface, the second film 244 may be removed from at least on the first electrode 238 and the second electrode. The second film 244 may be also formed inside the groove 248. Thereafter, the processes described in the first example implementation may be performed. The above procedure is an example, and other procedures are also possible. This example implementation also provides the advantageous effect described in the first example implementation.

Figure 8:
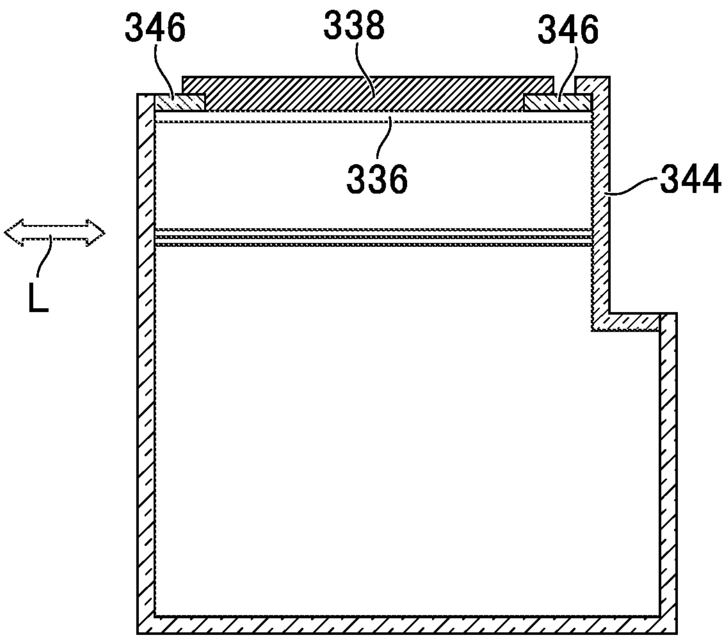
FIG. 8 is a cross-sectional view of a semiconductor optical device in a third example implementation.

FIG. 8 is a cross-sectional view of a semiconductor optical device in a third example implementation. The second film 344 may comprise the same material (e.g., metal) as the first electrode 338, and may have the same layer structure (e.g., multiple layers). The edge of the second film 344 may be spaced next to the edge of the first electrode 338. Thus, the second film 344 may be insulated from the first electrode 338 and may be also insulated from the second electrode. The semiconductor optical device may include the insulating film 346. The insulating film 346 may be continuous under the edge of the second film 344 and under the edge of the first electrode 338. The insulating film 346 may comprise a material different from the second film 344. The manufacturing method is as follows.

Figure 9A:
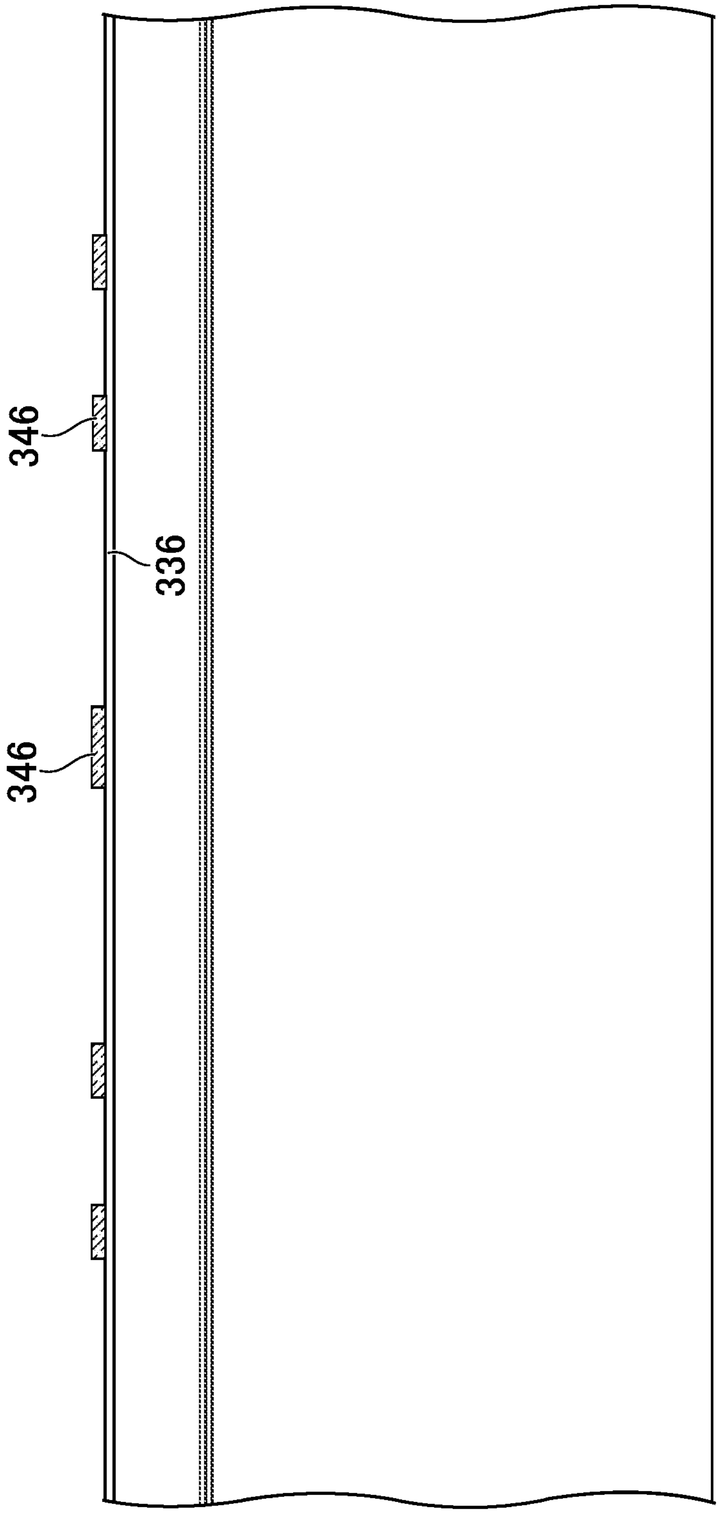
FIG. 9A is a diagram of a manufacturing method for the semiconductor optical device according to the third example implementation.
Figure 9B:
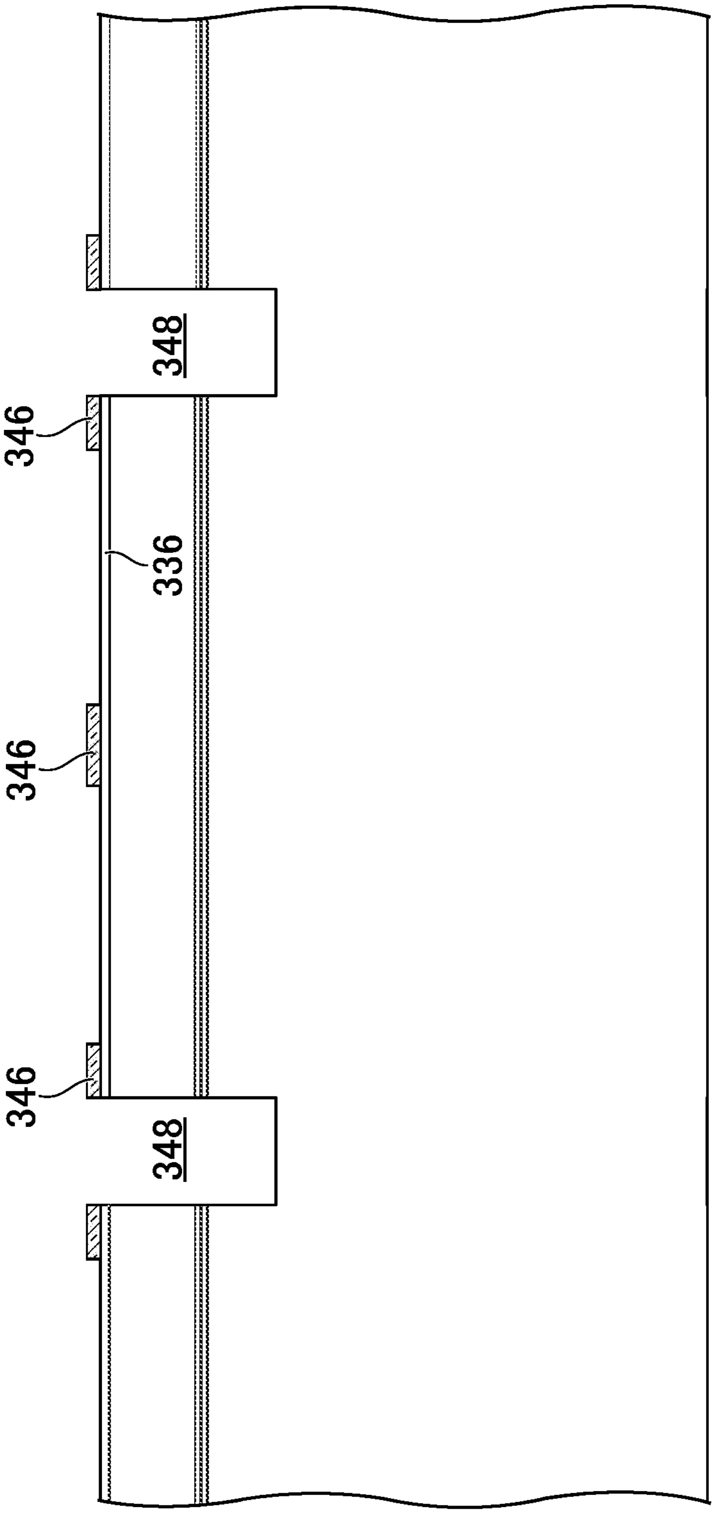
FIG. 9B is a diagram of the manufacturing method for the semiconductor optical device according to the third example implementation.
Figure 9C:
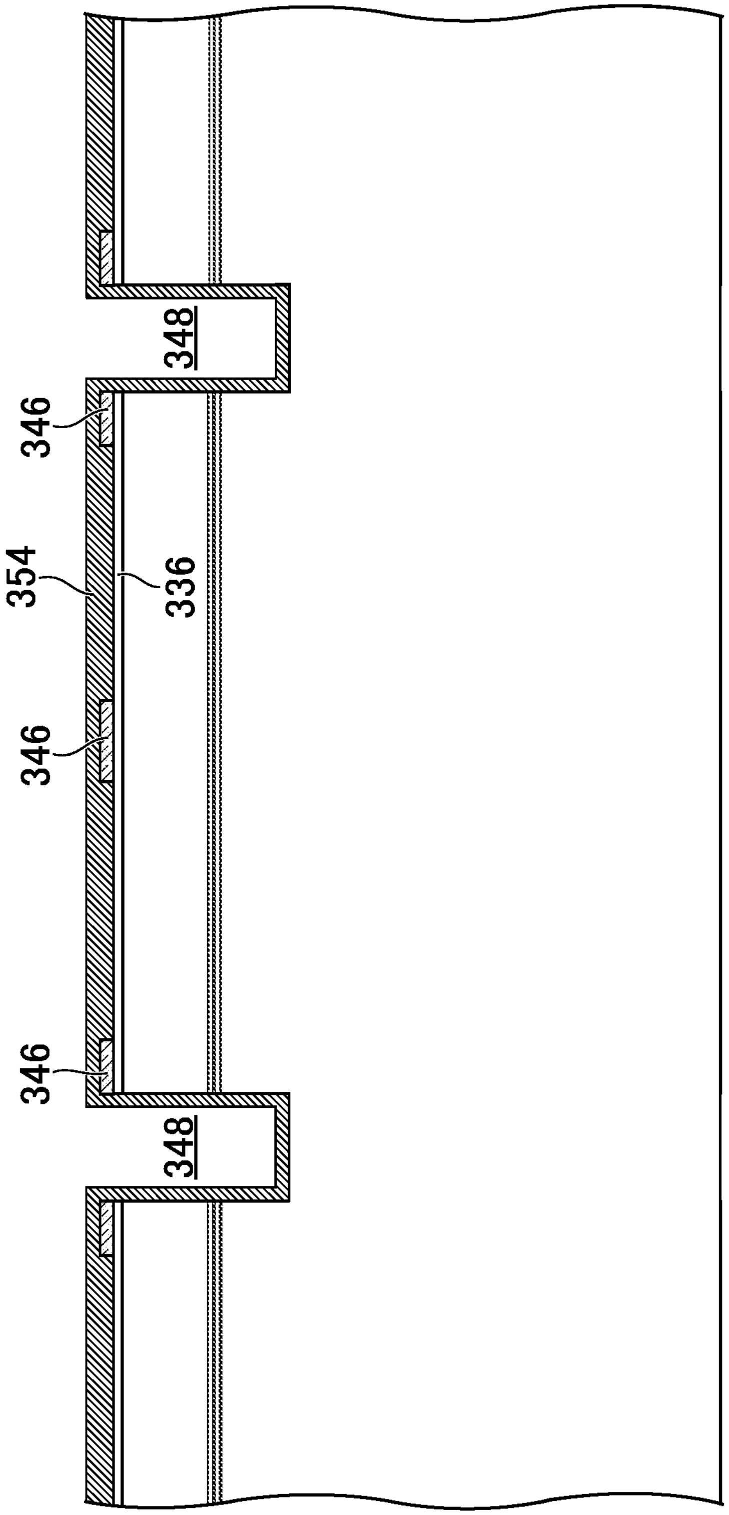
FIG. 9C is a diagram of the manufacturing method for the semiconductor optical device according to the third example implementation.

As shown in FIG. 9A, the insulating film 346 may be formed. As shown in FIG. 9B, the groove 348 may be formed. As shown in FIG. 9C, the metal film 354 may be formed over an entire surface. The contents described in the first example implementation are applicable to the contact layer 336 and the structure under it.

The wall surface of the groove 348 may be a vertical surface, so the metal film 354 may be thinner on the wall surface. The bottom surface of the groove 348 may be a narrow area, so the metal film 354 may be thinner. The contact layer 336 and the insulating film 346 may form a step, but the metal film 354 may be flat on them because the metal film 354 is sufficiently thick.

Figure 9D:
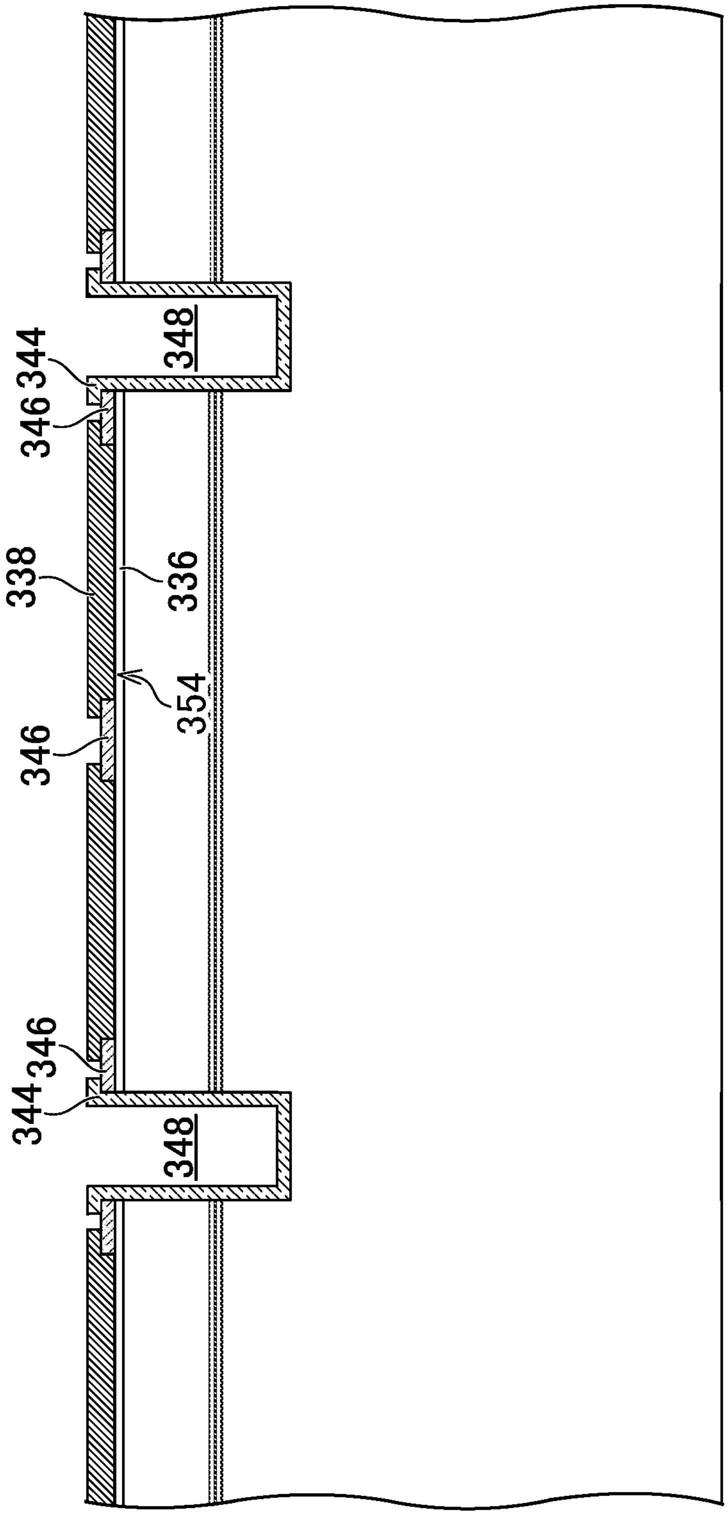
FIG. 9D is a diagram of the manufacturing method for the semiconductor optical device according to the third example implementation.

As shown in FIG. 9D, the metal film 354 may be separated. Part of the metal film 354 may be removed. This makes the second film 344 and the first electrode 338 separated (electrically isolated). Additionally, the second electrode may be formed. The processes described in the first example implementation are then performed. In this example implementation, the second film 344 may be formed at the same time as the first electrode 338 and the second electrode, thus reducing a manufacturing cost. This example implementation also provides the advantageous effect described in the first example implementation.

Figure 10:
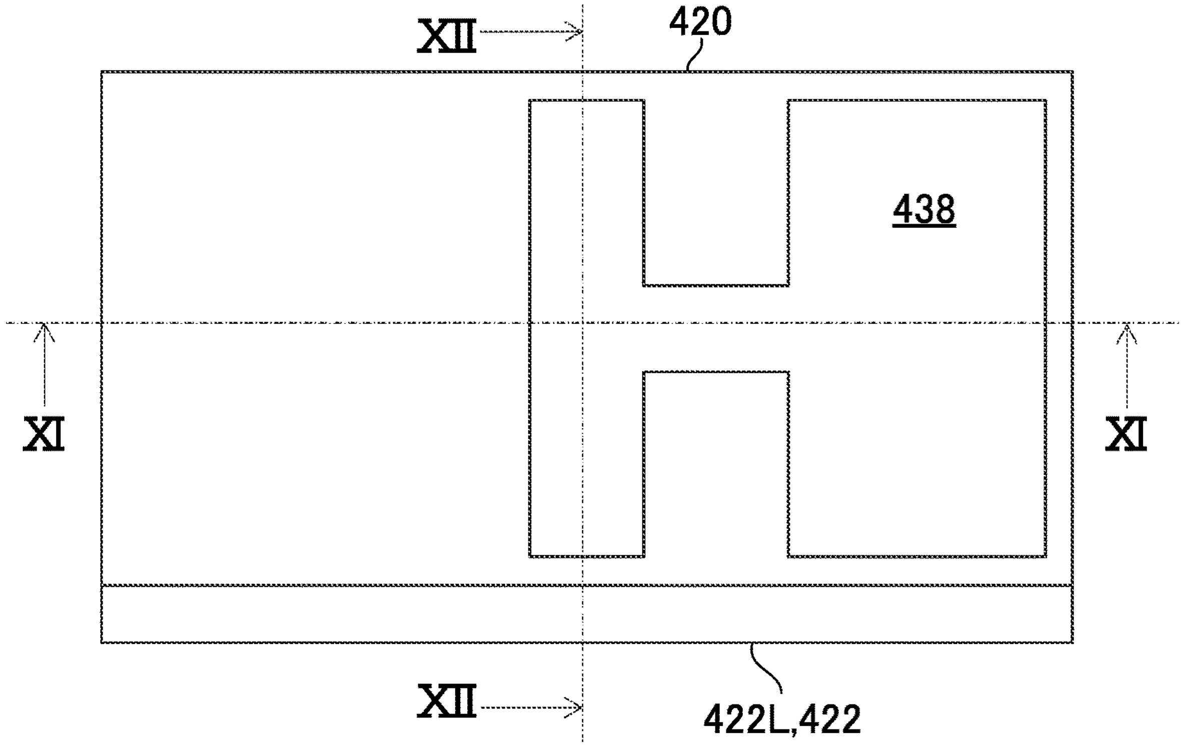
FIG. 10 is a plan view of a semiconductor optical device in a fourth example implementation.
Figure 11:
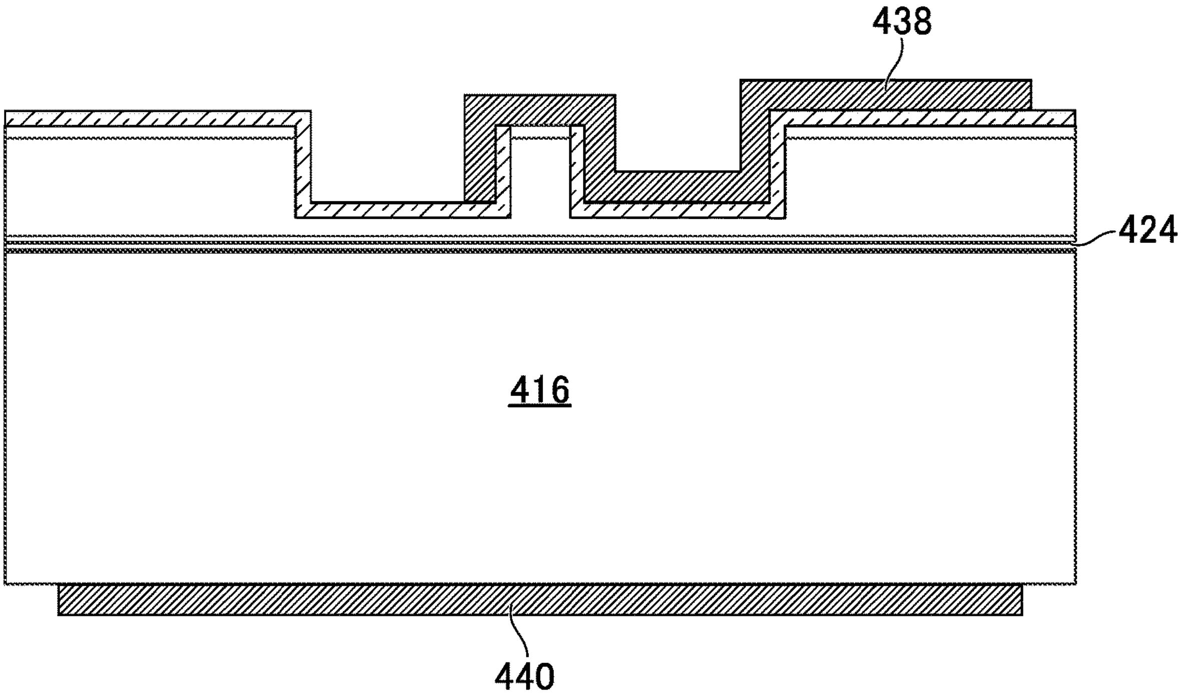
FIG. 11 is an XI-XI cross-sectional view of the semiconductor optical device in FIG.
Figure 12:
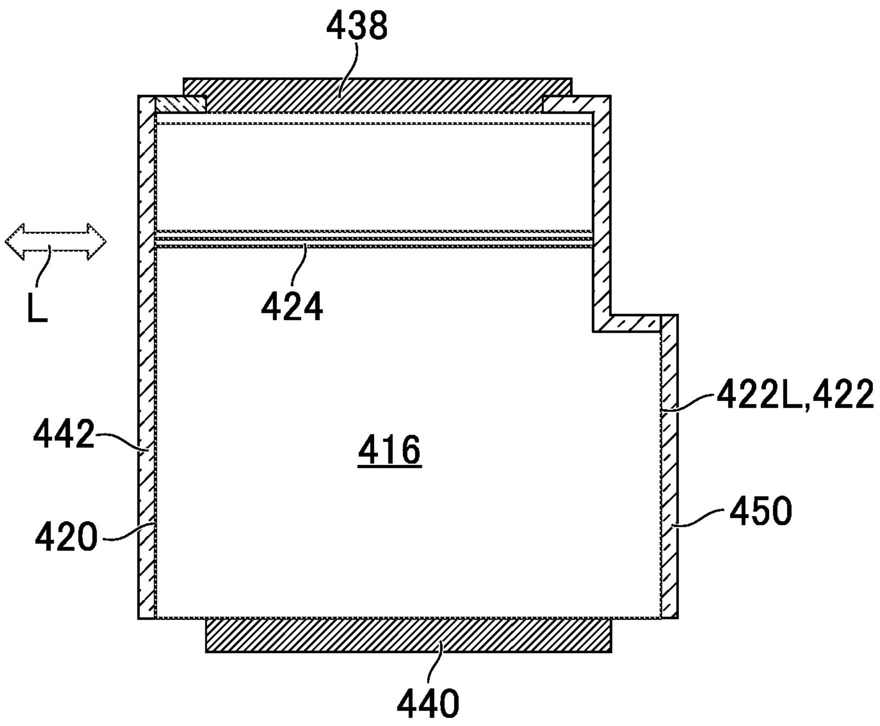
FIG. 12 is a XII-XII cross-sectional view of the semiconductor optical device in FIG.

FIG. 10 is a plan view of a semiconductor optical device in a fourth example implementation. FIG. 11 is an XI-XI cross-sectional view of the semiconductor optical device in FIG. 10. FIG. 12 is a XII-XII cross-sectional view of the semiconductor optical device in FIG. 10.

The semiconductor optical device may have a protection film 450 attached to the lower side 422L of the second side 422. The protection film 450 may be separated from the first film 442 but may comprise the same material as the first film 442. The protection film 450 may be referred to as a separated part of the first film 442.

In this example implementation, the first electrode 438 may be above the optical function layer 424, while the second electrode 440 may be below the optical function layer 424. During the forming process of the second electrode 440, it may be formed on the back of the substrate 416 (wafer) thinned beforehand. Then, cleavage may be performed as described in the first example implementation and the bars may be arranged on the stage or the tray, followed by formation of the first film 442 on the back of the substrate 416 (wafer) and the surface of the second electrode 440, the first side 420, and the lower side 422L of the second side 422. Then, the first film 442 may be removed from on the back of the substrate 416 (wafer) and the surface of the second electrode 440. Thus, the semiconductor optical device may be obtained. This example implementation is applicable to the first through third embodiments.

In a first implementation, a semiconductor optical device includes: a substrate 16 including a first side 20 and a second side 22 that are opposite to each other, the first side 20 being flat, the second side 22 including an upper side 22U and a lower side 22L, the lower side 22L protruding from the upper side 22U to form a step; an optical function layer 24 on a top of the substrate 16, the optical function layer 24 including a first end face 26 and a second end face 28 that are opposite to each other, the first end face 26 being flush with the first side 20, the second end face 28 being flush with the upper side 22U of the second side 22; a first film 42 continuously covering the first end face 26 and the first side 20; a second film 44 different in reflectance from the first film 42, the second film 44 continuously covering the second end face 28 and the upper side 22U of the second side 22; a first electrode 38 electrically connected to a top of the optical function layer 24; and a second electrode 40 electrically connected to a bottom of the optical function layer 24.

The first side 20 is flat, while a step is formed on the second side 22, making it easy to distinguish between a front and a rear of the semiconductor optical device.

In a second implementation, alone or in combination with the first implementation, the first film 42 avoids overlap with an underlying surface on which the first electrode 38 is disposed.

In a third implementation, alone or in combination with one or more of the first and second implementations, the second film 44 extends to the underlying surface.

In a fourth implementation, alone or in combination with one or more of the first through third implementations, the semiconductor optical device further including a protection film attached to the lower side 22L of the second side 22.

In a fifth implementation, alone or in combination with one or more of the first through fourth implementations, the first film 42 continuously extends to the lower side 22L of the second side 22, and the protection film is part of the first film 42.

In a sixth implementation, alone or in combination with one or more of the first through fifth implementations, the protection film 450 is separated from the first film 442 but is comprises the same material as the first film 442.

In a seventh implementation, alone or in combination with one or more of the first through sixth implementations, the semiconductor optical device further including a semiconductor layer 30 on the top of the optical function layer 24, the semiconductor layer 30 including a first tip surface 32 flush with the first end face 26, the semiconductor layer 30 including a second tip surface 34 flush with the second end face 28, the first film 42 continuously extending to the first tip surface 32, the second film 44 continuously extending to the second tip surface 34.

In an eighth implementation, alone or in combination with one or more of the first through seventh implementations, the first electrode 38 and the second electrode 40 are above the optical function layer 24.

In a ninth implementation, alone or in combination with one or more of the first through eighth implementations, the substrate 16 has a recess 18 in the top, the optical function layer 24 avoids being inside the recess 18, and the second electrode 40 extends to be inside the recess 18.

In a tenth implementation, alone or in combination with one or more of the first through ninth implementations, the first electrode 438 is above the optical function layer 424, and the second electrode 440 is below the optical function layer 424.

In an eleventh implementation, alone or in combination with one or more of the first through tenth implementations, the second film 44 continuously extends from the second end face 28 to overlap under an edge of the first electrode 38.

In a twelfth implementation, alone or in combination with one or more of the first through eleventh implementations, the semiconductor optical device further including an insulating film 46 overlapping under another edge of the first electrode 38, the insulating film 46 comprising the same material as the second film 44.

In a thirteenth implementation, alone or in combination with one or more of the first through twelfth implementations, an edge of the second film 244 is spaced next to an edge of the first electrode 238, the semiconductor optical device further including an insulating film 246 continuously overlapping under the edge of the second film 244 and under the edge of the first electrode 238, the insulating film 246 comprising a material different from the second film 244.

In a fourteenth implementation, alone or in combination with one or more of the first through thirteenth implementations, the first film 42 is lower in the reflectance than the second film 44.

In a fifteenth implementation, alone or in combination with one or more of the first through fourteenth implementations, the second film 44 comprises an insulator.

In a sixteenth implementation, alone or in combination with one or more of the first through fifteenth implementations, the second film 344 comprises the same material as the first electrode 338.

The embodiments described above are not limited, and different variations are possible. The structures explained in the embodiments may be replaced with substantially the same structures and other structures that can achieve the same effect or the same objective.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "bottom," "above," "upper," "top" and the like, may be used herein for ease of description to describe one element or feature's relationship to another element(s) or feature(s) as illustrated in the figures. The spatially relative terms may be intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A semiconductor optical device comprising:

a substrate including a first side and a second side that are opposite to each other, the first side being flat, the second side including an upper side and a lower side, the lower side protruding from the upper side to form a step;

an optical function layer on a top of the substrate, the optical function layer including a first end face and a second end face that are opposite to each other, the first end face being flush with the first side, the second end face being flush with the upper side of the second side, wherein the semiconductor optical device is configured to emit light via the first side via the optical function layer along a direction of a length of the optical function layer towards the first side and not in a direction perpendicular to the length of the optical function layer, and wherein the emitted light is generated based on the optical function layer oscillating the light in response to an injected current;

a first film continuously covering the first end face and the first side;

a second film different in reflectance from the first film, the second film continuously covering the second end face and the upper side of the second side;

a first electrode electrically connected to a top of the optical function layer, wherein the first electrode is parallel to the optical function layer, and wherein the second film continuously extends from the second end face to overlap under an edge of the first electrode; and a second electrode electrically connected to a bottom of the optical function layer.

2. The semiconductor optical device according to claim 1, wherein the first film avoids overlap with an underlying surface on which the first electrode is disposed.

3. The semiconductor optical device according to claim 2, wherein the second film extends to the underlying surface.

4. The semiconductor optical device according to claim 1, further comprising a protection film attached to the lower side of the second side.

5. The semiconductor optical device according to claim 4, wherein the first film continuously extends to the lower side of the second side, and the protection film is part of the first film.

6. The semiconductor optical device according to claim 1, further comprising a semiconductor layer on the top of the optical function layer, the semiconductor layer including a first tip surface flush with the first end face, the semiconductor layer including a second tip surface flush with the second end face, the first film continuously extending to the first tip surface, and the second film continuously extending to the second tip surface.

7. The semiconductor optical device according to claim 1, wherein the first electrode and the second electrode are above the optical function layer.

8. The semiconductor optical device according to claim 7, wherein the substrate has a recess in the top, the optical function layer avoids being inside the recess, and the second electrode extends to be inside the recess.

9. The semiconductor optical device according to claim 1, wherein the first electrode is above the optical function layer, and the second electrode is below the optical function layer.

10. The semiconductor optical device according to claim 1, further comprising an insulating film overlapping under another edge of the first electrode, the insulating film comprising the same material as the second film.

11. The semiconductor optical device according to claim 1, wherein the first film is lower in the reflectance than the second film.

12. The semiconductor optical device according to claim 1, wherein the second film comprises an insulator.

13. The semiconductor optical device according to claim 1, wherein the light emitted via the first side via the optical function layer is a laser.

14. The semiconductor optical device according to claim 1, wherein the upper side has a height equal to or less than one tenth of an overall thickness of the semiconductor optical device.

15. The semiconductor optical device according to claim 1, wherein the optical function layer oscillates light in response to an injected current.

16. The semiconductor optical device according to claim 1, wherein the optical function layer is configured to be an absorption layer that absorbs light incoming from the first side when the semiconductor optical device is configured to be a modulator or a photo detector.

17. A device comprising:

a substrate including a first side and a second side that are opposite to each other, the first side being flat, the second side including an upper side and a lower side, the lower side protruding from the upper side to form a step;

an optical function layer on a top of the substrate, the optical function layer including a first end face and a second end face that are opposite to each other, the first end face being flush with the first side, the second end face being flush with the upper side of the second side, wherein the device is configured to emit light via the first side via the optical function layer along a direction of a length of the optical function layer towards the first side and not in a direction perpendicular to the length of the optical function layer, and wherein the emitted light is generated based on the optical function layer oscillating the light in response to an injected current;

a first film continuously covering the first end face and the first side;

a second film different in reflectance from the first film, the second film continuously covering the second end face and the upper side of the second side;

a first electrode electrically connected to a top of the optical function layer, wherein the first electrode is parallel to the optical function layer, and wherein an edge of the second film is spaced next to an edge of the first electrode;

a second electrode electrically connected to a bottom of the optical function layer; and an insulating film continuously overlapping under the edge of the second film and under the edge of the first electrode, wherein the insulating film comprises a material different from the second film.

18. A device, comprising:

a substrate including a first side and a second side that are opposite to each other, the second side including an upper side and a lower side, the lower side protruding from the upper side to form a step;

an optical function layer on a top of the substrate, the optical function layer spanning from the first side to the second side, wherein the optical device is configured to emit light via the first side via the optical function layer along a direction of a length of the optical function layer towards the first side and not in a direction perpendicular to the length of the optical function layer, and wherein the emitted light is generated based on the optical function layer oscillating the light in response to an injected current;

a first film continuously covering a first end face and the first side;

a second film different in reflectance from the first film, the second film continuously covering a second end face and the upper side of the second side; and a first electrode electrically connected to a top of the optical function layer, wherein the first electrode is parallel to optical function layer, and wherein the second film continuously extends from the second end face to overlap under an edge of the first electrode.

19. A method, comprising:

injecting current to an optical device; and emitting light via an optical function layer of the optical device, wherein the optical device comprises:

a substrate including a first side and a second side that are opposite to each other, the second side including an upper side and a lower side, the lower side protruding from the upper side to form a step;

the optical function layer configured to be on a top of the substrate, the optical function layer spanning from the first side to the second side, wherein the device is configured to emit the light via the first side via the optical function layer along a direction of a length of the optical function layer towards the first side and not in a direction perpendicular to the length of the optical function layer, and wherein the emitted light is generated based on the optical function layer oscillating the light in response to an injected current;

a first film continuously covering a first end face and the first side;

a second film different in reflectance from the first film, the second film continuously covering a second end face and the upper side of the second side; and a first electrode electrically connected to a top of the optical function layer, wherein the first electrode is parallel to optical function layer, and wherein the second film continuously extends from the second end face to overlap under an edge of the first electrode.

20. The device of claim 18, wherein the second film comprises an insulator.

* * * * *